(12) United States Patent
Nakazawa et al.

(10) Patent No.: US 7,332,385 B2
(45) Date of Patent: Feb. 19, 2008

(54) METHOD OF MANUFACTURING A SEMICONDUCTOR DEVICE THAT INCLUDES GETTERING REGIONS

(75) Inventors: Misako Nakazawa, Tochigi (JP); Naoki Makita, Nara (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 0 days.

(21) Appl. No.: 10/365,911

(22) Filed: Feb. 13, 2003

(65) Prior Publication Data

US 2003/0173566 A1    Sep. 18, 2003

(30) Foreign Application Priority Data

Feb. 21, 2002    (JP) .............................. 2002-045239

(51) Int. Cl.
  *H01L 21/00*    (2006.01)
(52) U.S. Cl. .................. 438/154; 438/149; 438/471; 257/E21.318; 257/E21.411
(58) Field of Classification Search ................ 438/149, 438/153, 158, 164, 166, 197, 199, 471, 473, 438/476, 154; 257/E21.318, E21.411
See application file for complete search history.

(56) References Cited

U.S. PATENT DOCUMENTS

| | | | |
|---|---|---|---|
| 5,501,989 A | 3/1996 | Takayama et al. ............ 437/21 |
| 5,563,426 A | 10/1996 | Zhang et al. ................. 257/66 |
| 5,589,694 A | 12/1996 | Takayama et al. ............ 257/67 |
| 5,643,826 A | 7/1997 | Ohtani et al. | |
| 5,744,822 A | 4/1998 | Takayama et al. ............ 257/66 |
| 5,780,903 A * | 7/1998 | Tsai et al. ................... 257/344 |
| 5,893,990 A | 4/1999 | Tanaka | |
| 5,923,962 A | 7/1999 | Ohtani et al. | |
| 6,031,249 A | 2/2000 | Yamazaki et al. ............ 257/66 |
| 6,046,479 A * | 4/2000 | Young et al. ................ 257/350 |

(Continued)

FOREIGN PATENT DOCUMENTS

EP    0 862 201 A2    9/1998

(Continued)

OTHER PUBLICATIONS

U.S. Appl. No. 10/000,238 to Nakajima et al filed Nov. 2, 2001, including specification, abstract, claims and drawings.

(Continued)

*Primary Examiner*—Michael Lebentritt
*Assistant Examiner*—Stanetta Isaac
(74) *Attorney, Agent, or Firm*—Cook, Alex, McFarron, Manzo, Cummings & Mehler, Ltd.

(57) ABSTRACT

A catalytic element is added to an amorphous semiconductor film and heat treatment is conducted therefor to produce a crystalline semiconductor film with good quality, a TFT (semiconductor device) with a satisfactory characteristic is realized using the crystalline semiconductor film. A semiconductor layer includes a region containing an impurity element which has a concentration of $1 \times 10^{19}/cm^3$ to $1 \times 10^{21}/cm^3$ and belongs to group 15 of the periodic table and an impurity element which has a concentration of $1.5 \times 10^{19}/cm^3$ to $3 \times 10^{21}/cm^3$ and belongs to group 13 of the periodic table, and the region is a region to which a catalytic element left in the semiconductor film (particularly, the channel forming region) moves.

49 Claims, 15 Drawing Sheets

U.S. PATENT DOCUMENTS

| | | | |
|---|---|---|---|
| 6,066,518 A * | 5/2000 | Yamazaki | 438/166 |
| 6,072,193 A * | 6/2000 | Ohnuma et al. | 257/57 |
| 6,133,075 A | 10/2000 | Yamazaki et al. | |
| 6,166,397 A * | 12/2000 | Yamazaki et al. | 257/59 |
| 6,197,626 B1 | 3/2001 | Yamazaki et al. | 438/159 |
| 6,251,712 B1 | 6/2001 | Tanaka et al. | |
| 6,278,131 B1 | 8/2001 | Yamazaki et al. | 257/59 |
| 6,278,132 B1 | 8/2001 | Yamazaki et al. | 257/69 |
| 6,294,441 B1 * | 9/2001 | Yamazaki | 438/486 |
| 6,424,012 B1 * | 7/2002 | Kawasaki et al. | 257/350 |
| 6,426,276 B1 * | 7/2002 | Ohnuma et al. | 438/476 |
| 6,432,756 B1 | 8/2002 | Ohtani et al. | |
| 6,452,211 B1 | 9/2002 | Ohtani et al. | |
| 6,465,288 B1 | 10/2002 | Ohnuma | |
| 6,506,636 B2 | 1/2003 | Yamazaki et al. | |
| 6,620,711 B2 | 9/2003 | Yamazaki | 438/486 |
| 6,693,299 B1 | 2/2004 | Yamazaki et al. | 257/66 |
| 6,706,544 B2 * | 3/2004 | Yamazaki et al. | 438/30 |
| 6,727,124 B2 | 4/2004 | Nakajima et al. | 438/154 |
| 6,737,306 B2 * | 5/2004 | Yamazaki et al. | 438/155 |
| 6,835,986 B2 | 12/2004 | Nakajima et al. | 257/371 |
| 6,884,664 B2 * | 4/2005 | Fujimoto et al. | 438/149 |
| 6,998,641 B2 | 2/2006 | Makita et al. | |
| 2001/0016376 A1 | 8/2001 | Yamazaki et al. | 438/156 |
| 2001/0025992 A1 | 10/2001 | Nakajima et al. | 257/347 |
| 2001/0029070 A1 | 10/2001 | Yamazaki et al. | 438/149 |
| 2001/0038127 A1 | 11/2001 | Yamazaki et al. | 257/359 |
| 2001/0048115 A1 | 12/2001 | Yamazaki et al. | 257/154 |
| 2002/0004291 A1 | 1/2002 | Yamazaki | 438/486 |
| 2002/0028544 A1 | 3/2002 | Fujimoto et al. | |
| 2002/0053671 A1 | 5/2002 | Koyama | 257/66 |
| 2002/0053674 A1 | 5/2002 | Nakajima et al. | |
| 2003/0025158 A1 | 2/2003 | Makita et al. | |
| 2005/0170573 A1 | 8/2005 | Makita et al. | |

FOREIGN PATENT DOCUMENTS

| | | |
|---|---|---|
| EP | 1 020 920 A2 | 7/2000 |
| EP | 1 271 656 A2 | 1/2003 |
| JP | 7-130652 | 5/1995 |
| JP | 7130652 A | 5/1995 |
| JP | 10125926 A2 | 5/1998 |
| JP | 11054760 A | 2/1999 |
| JP | 2000-133594 | 5/2000 |
| JP | 2002-222960 A2 | 8/2000 |
| JP | 2001-155995 | 6/2001 |
| JP | 2002-25905 | 1/2002 |
| JP | 2003-17500 | 1/2003 |

OTHER PUBLICATIONS

U.S. Appl. No. 10/183,056 to Makita et al filed Jun. 27, 2002, including specification, abstract, claims, drawings and PTO filing receipt.

English abstract re Japanese Patent Application No. JP 7-130652, published May 19, 1995.

Chinese Patent Office First Office Action, re Chinese patent application No. CN 03105465.X, dated Jun. 9, 2006.

* cited by examiner

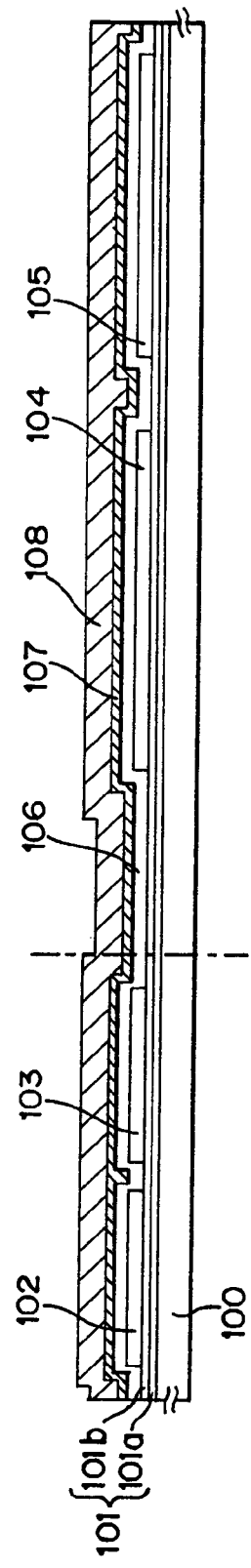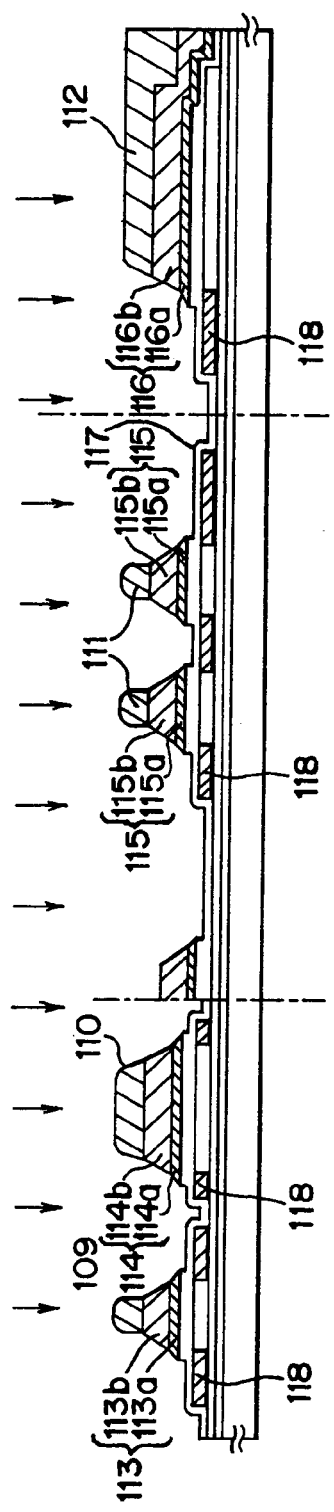
FIG.3A
FIG.3B

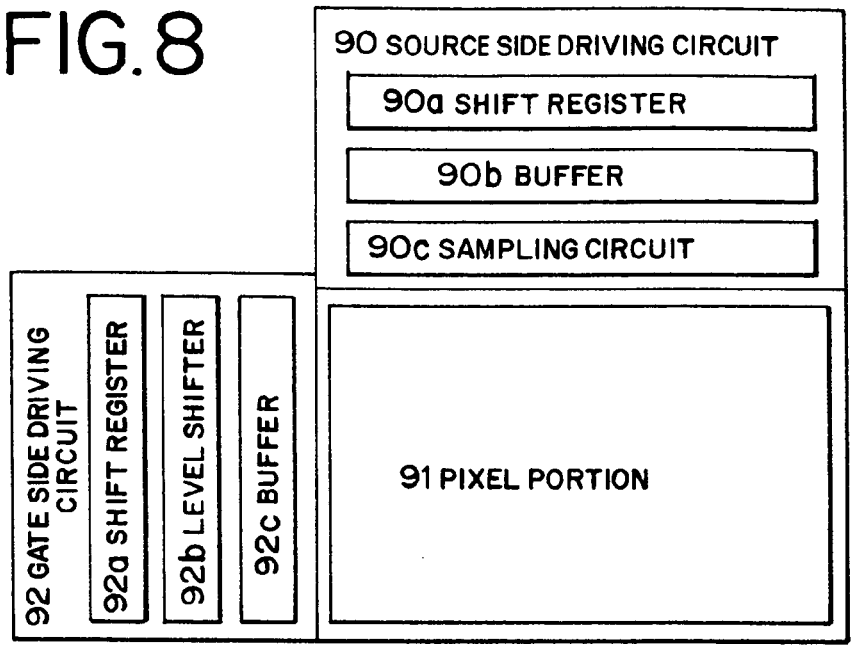
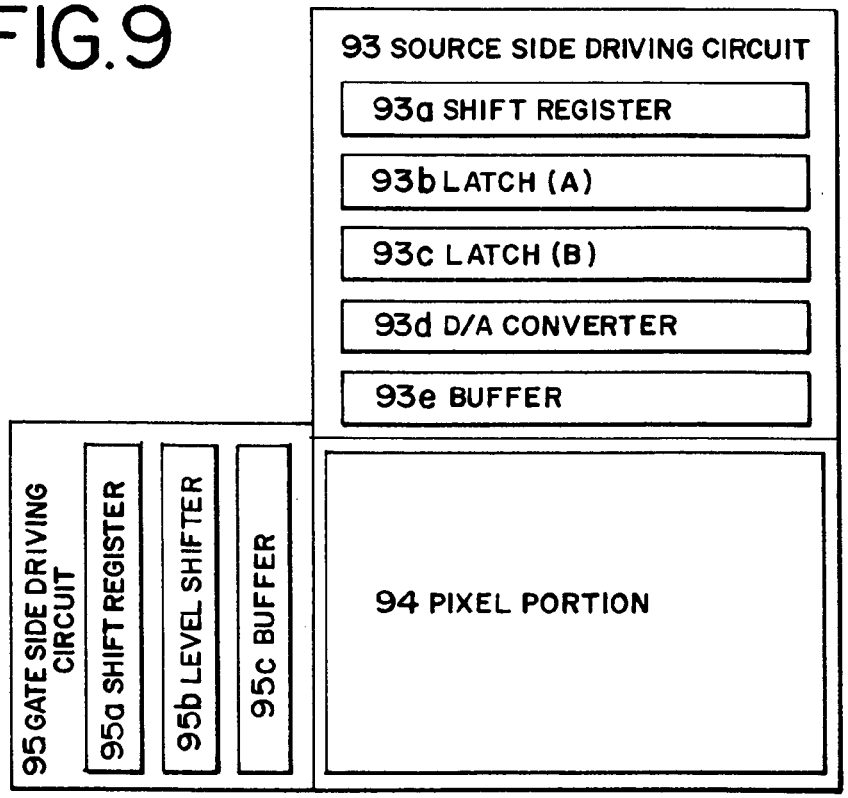

METHOD OF MANUFACTURING A SEMICONDUCTOR DEVICE THAT INCLUDES GETTERING REGIONS

BACKGROUND OF THE INVENTION

1. Field of the Invention

The present invention relates to a semiconductor device and a method of adding a metallic element having a function for promoting crystallization to an amorphous semiconductor film and conducting heat treatment to form a crystalline semiconductor film, and manufacturing a thin film transistor (TFT) using the crystalline semiconductor film.

2. Description of the Related Art

A liquid crystal display device in which a pixel portion and a driver circuit are provided on the same substrate is used as a monitor for a personal computer (PC) and further begins to expand into ordinary households. For example, a liquid crystal display instead of a CRT (cathode-ray tube) is introduced as a television into ordinary households. In addition, a front projector for watching a movie or playing a game is introduced for recreation into ordinary households. Thus, the market size of the liquid crystal display device is rapidly being expanded. Further, the development of a system on panel in which logic circuits such as a memory circuit and a clock generating circuit are incorporated on a glass substrate is actively progressed.

When high resolution image display is conducted, the amount of information written into a pixel is increased. Further, if the information is not written for a short time, it is impossible that moving picture display is conducted for images with an enormous amount of information for high definition display. Thus, high speed operation is required for a TFT used for the driver circuit. In order to allow the high speed operation, it is required that the TFT is realized using a crystalline semiconductor film having satisfactory crystallinity by which high field effect mobility is obtained.

As a method of obtaining a satisfactory crystalline semiconductor film on a glass substrate, the present inventor et al has developed a technique for adding a metallic element having a function for promoting crystallization to an amorphous semiconductor film and then conducting heat treatment to obtain a satisfactory semiconductor film in which crystal orientations are aligned.

However, with respect to a TFT manufactured using as a semiconductor layer a crystalline silicon film obtained using a catalytic element without processing, there is a problem in that an off current is suddenly increased. The catalytic elements are irregularly segregated in the semiconductor film, and more particularly, the segregation is markedly recognized in a grain boundary. Thus, it is considered that the segregation of the catalytic elements becomes a current escape path (leakage path) and this causes a sudden increase in off current. Accordingly, it is required that, after the crystalline silicon film forming process, the catalytic elements are moved from the semiconductor film to reduce a concentration of the catalytic elements in the semiconductor film.

In order to reduce a concentration of residual catalytic elements in the semiconductor film, the following method is considered. That is, an impurity element belonging to group 15 of the periodic table (typically, phosphorus or arsenic: impurity element for imparting an n-type) and an impurity element belonging to group 13 of the periodic table (typically, boron or aluminum: impurity element for imparting a p-type), each of which has a function for moving catalytic elements, are added at a high concentration to a region which becomes a source region or a drain region of a semiconductor layer of an n-channel TFT and a p-channel TFT or a region to which catalytic elements are moved (hereinafter referred to as a gettering region), and heat treatment is conducted to move the catalytic elements. Thus, a concentration of the catalytic elements contained in a channel forming region particularly is reduced.

However, according to the method of using the source region or the drain region as the gettering region, the impurity element which imparts the n-type and belongs to group 15 of the periodic table (typically, phosphorus or arsenic) needs to be added at a higher concentration than the impurity element which imparts the p-type and belongs to group 13 of the periodic table (typically, boron or aluminum) to a region which becomes the n-channel TFT later. On the other hand, in the case of the p-channel TFT, the impurity element which imparts the p-type and belongs to group 13 of the periodic table (typically, boron or aluminum) needs to be added at a higher concentration than the impurity element which imparts the n-type and belongs to group 15 of the periodic table (typically, phosphorus or arsenic). In other words, concentrations of added impurities in the gettering regions of semiconductor layers with different conductivities are different from each other. Thus, there is a problem in that a difference is caused between the n-channel TFT and the p-channel TFT with respect to efficiency that catalytic elements uniformly contained in the semiconductor films move to the gettering regions.

Note that the present inventor et al. observe efficiency that the catalytic element moves to the gettering region using the following method.

For example, when a catalytic element (nickel) moves to a gettering region by the influence of an element added to the gettering region, it is considered that the catalytic element (Ni) is bonded to Si in the process in which the catalytic element moves from the channel forming region to the gettering region, thereby becoming $NiSi_x$ (nickel silicide). As to nickel silicide, a silicon oxide film is removed by a mixture solution containing ammonium hydrogen fluoride ($NH_4HF_2$) at 7.13% and ammonium fluoride ($NH_4F$) at 15.4% (which is produced by Stella Chemifa Corporation and whose product name is LAL500), and then a sample substrate is immersed for 40 minutes in a chemical solution mixed at a volume ratio of HF (50% in concentration):$H_2O_2$ (33% in concentration):$H_2O$=45:72:4500 (hereinafter referred to as an FPM solution). Thus, $NiSi_x$ can be selectively removed.

A portion in which $NiSi_x$ has been removed becomes a pore. The pore produced by removing $NiSi_x$ is observed as a black spot in a transmission mode of an optical microscope. When the number of black spots is large, it is estimated that a large number of catalytic elements (nickel) can be moved to the gettering region. In other words, it is estimated that gettering efficiency is good.

It is difficult that an impurity element for imparting a p-type is sufficiently added to the source region or the drain region of the n-channel TFT without increasing the number of steps. Thus, a difference of concentrations of the impurity elements added to the semiconductor layers of the n-channel TFT and the p-channel TFT relates to a difference of efficiencies that the catalytic element moves to the gettering region so that this becomes a cause of a problem in that a variation in element characteristics is caused.

Also, as to another problem, it is required for the p-channel TFT that a region to which an impurity element for imparting an n-type is added at a high concentration for gettering processing to a catalytic element is reversed to have a p-type (counter doping). When an n-type is reversed to a p-type in the semiconductor layer of the p-channel TFT, it is necessary to add a p-type impurity element with a concentration 1.5 times to 3 times larger than that of an n-type impurity element, and the crystallinity of the source region or the drain region of the p-channel TFT is destroyed by the counter doping. Thus, there is a problem in that inconveniences related to a TFT element such as an increase in resistivity and a reduction in on current value may be caused.

SUMMARY OF THE INVENTION

Therefore, the present invention has been made in view of the above problems. One of objects of the present invention is therefore to solve these problems, produce a crystalline semiconductor film with good quality, and realize TFTs (semiconductor devices) with satisfactory characteristics using the crystalline semiconductor film. In addition, one of the objects of the present invention is to provide a method of realizing such a semiconductor device without increasing the number of manufacturing steps.

According to the present invention, it is characterized in that a semiconductor layer includes a region containing an impurity element which has a concentration of $1\times10^{19}/cm^3$ to $1\times10^{21}/cm^3$ and belongs to group 15 of the periodic table and an impurity element which has a concentration of $1.5\times10^{19}/cm^3$ to $3\times10^{21}/cm^3$ and belongs to group 13 of the periodic table, and that the region is a region to which a catalytic element left in a semiconductor film (particularly, a channel forming region) moves.

Also, it is characterized in that the region containing an impurity element which has a concentration of $1\times10^{19}/cm^3$ to $1\times10^{21}/cm^3$ and belongs to group 15 of the periodic table and an impurity element which has a concentration of $1.5\times10^{19}/cm^3$ to $3\times10^{21}/cm^3$ and belongs to group 13 of the periodic table in the semiconductor layer is a gettering region to which the catalytic element left in the semiconductor film moves by heat treatment, and is formed so as not to be adjacent to the channel forming region. Thus, gettering for a junction portion between the channel region and the source region and a junction portion between the channel region and the drain region is possible so that an increase in leak current at TFT off operation, resulting from segregation and residual of the catalytic element in those positions, can be suppressed.

Further, according to the present invention, it is characterized in that the gettering region is formed in an outer edge portion of the semiconductor layer, and connection between the semiconductor layer and a wiring for electrically connecting between the respective TFTs is made in a region including a portion of the gettering region and in a region except the gettering region. Thus, when the connection between the semiconductor layer and the wiring is made through at least a portion of the region (source/drain region) except the gettering region, a path of a TFT carrier (electron or hole) can be ensured without passing through the gettering region so that a sufficient on current can be achieved for the TFTs.

Further, according to the present invention, even in a structure in which semiconductor layers of a plurality of TFTs are connected with one another, a gettering region is provided in respective regions in which they are connected, and is located outside a region to which a TFT carrier (electron or hole) moves. Thus, the same gettering effect as in a single structured TFT can be obtained.

As to a gettering effect to a catalytic element in a TFT channel region, gettering efficiency of the gettering region is most dominant. Thus, when the present invention is applied, the n-channel TFT and the p-channel TFT each contain a gettering element at the same concentration. Therefore, the respective gettering regions in the n-channel TFT and the p-channel TFT have the same gettering capacity so that gettering efficiency in the n-channel TFT can be made equal to that in the p-channel TFT. Accordingly, the concentrations of catalytic elements left in both the n-channel TFT and the p-channel TFT become substantially the same so that a variation in element characteristic resulting from a residual concentration of catalytic elements can be reduced. Further, the catalytic elements can be sufficiently moved to the gettering region so as not to segregate in the channel forming region and a junction portion between the channel forming region and the source region or the drain region.

Further, according to the present invention, when the n-channel TFT and the p-channel TFT are paired, a ratio S/W of the area S of the gettering region to the width W of the channel forming region in the n-channel TFT is substantially equal to that in the p-channel TFT. In addition, a distance from the junction portion between the source region or the drain region and the channel forming region to the gettering region in the n-channel TFT is substantially equal to that in the p-channel TFT.

As to the gettering effect to the catalytic element in the TFT channel region, the gettering efficiency of the gettering region is most dominant. For another factor, (i) a ratio of the area S of the gettering region to the area of a non-gettering region in a TFT channel region and (ii) a distance L from the TFT channel region to the gettering region are important parameters. As the gettering region area S increases, the gettering capacity is improved more. Thus, the gettering efficiency in the channel region is determined by the ratio S/W of the area S of the gettering region to the width W of the channel forming region. In addition, the distance L from the channel region (junction portion between the source/drain region and the channel forming region) to the gettering region becomes a gettering distance necessary to move the catalytic element by gettering so that the gettering efficiency in the channel forming region is greatly influenced thereby. As to the respective parameters, as the ratio S/W of the area S of the gettering region to the width W of the channel forming region is larger, the gettering effect is improved more. As the distance L from the channel region (junction portion between the source/drain region and the channel forming region) to the gettering region is shorter, the gettering effect is improved. According to the present invention, it is an object that these parameters are made to become substantially the same in the n-channel TFT and the p-channel TFT so that the gettering efficiency in the n-channel TFT is made further equal to that in the p-channel TFT. Therefore, the concentrations of catalytic elements left in both the n-channel TFT and the p-channel TFT become substantially the same so that a variation in element characteristic resulting from a residual concentration of catalytic elements can be reduced.

Also, according to the present invention, there is provided a method of manufacturing a semiconductor device characterized by including: forming an amorphous semiconductor film on an insulator; adding a catalytic element to the amorphous semiconductor film; conducting first heat treatment for the amorphous semiconductor film to form a crystalline semiconductor film; etching the crystalline semiconductor film to form a semiconductor layer; forming a gate insulating film on the semiconductor layer; forming a gate electrode on the gate insulating film in respective regions which become an n-channel TFT and a p-channel TFT later; adding an impurity element for imparting an n-type to a source region, a drain region, and a gettering region in a semiconductor layer of the n-channel TFT and a gettering region in a semiconductor layer of the p-channel TFT; adding an impurity element for imparting a p-type to the gettering region in the semiconductor layer of the n-channel TFT and a source region, a drain region, and the gettering region in the semiconductor layer of the p-channel TFT; and then conducting second heat treatment to move the catalytic element in the semiconductor layer to the gettering region to which the impurity element for imparting the n-type and the impurity element for imparting the p-type are added.

Also, according to the present invention, impurity elements added to the gettering regions formed in the semiconductor layers in the n-channel TFT and the p-channel TFT are an impurity element for imparting an n-type and an impurity element for imparting a p-type, and concentrations of the respective impurity elements are $1\times10^{19}$/cm$^3$ to $1\times10^{21}$/cm$^3$ and $1.5\times10^{19}$/cm$^3$ to $3\times10^{21}$/cm$^3$.

In order not to complicate a manufacturing process, the gate electrode produced during the manufacturing process is used as a mask for preventing the semiconductor layer of the p-channel TFT from being added with an n-type impurity element.

When the present invention is applied, the gettering regions formed in the semiconductor layers in the n-channel TFT and the p-channel TFT are produced by steps of adding the impurity element for imparting the n-type and the impurity element for imparting the p-type. Thus, an additional step for gettering is completely unnecessary so that a TFT manufacturing process can be simplified and a manufacturing cost can be reduced. Further, as to a catalytic element gettering step used in a semiconductor film crystallization step, the gettering efficiencies in the n-channel TFT and the p-channel TFT can be made equal. Furthermore, the catalytic elements can be sufficiently moved to the gettering region so as not to segregate in the channel forming region and the junction portion between the channel forming region and the source region or the drain region.

Therefore, the occurrence of a leak current resulting from the segregation of catalytic elements can be suppressed. In particular, when used as a switching element in a pixel portion, TFTs with satisfactory characteristics can be realized.

Also, a semiconductor film for which crystallization using a catalytic element is performed indicates satisfactory crystallinity. Thus, even when used as elements for a driver circuit for which high field effect mobility is required, the TFTs manufactured according to the present invention can obtain satisfactory characteristics.

BRIEF DESCRIPTION OF THE DRAWINGS

In the accompanying drawings:
FIGS. 3A and 3B show an embodiment of the present invention.

FIG. 8 shows an embodiment of the present invention;
FIG. 9 shows an embodiment of the present invention.

DETAILED DESCRIPTION OF THE PREFERRED EMBODIMENTS

An embodiment mode of the present invention will be described using FIGS. 1A to 1E and 2A to 2C. Here, a method of manufacturing an n-channel TFT and a p-channel TFT on the same substrate will be described.

A base insulating film 11 comprising silicon nitride and having a film thickness of 100 nm is formed on a glass substrate 10 and then an amorphous silicon film 12 having a film thickness of 20 nm to 100 nm is formed thereon.

Figure 1A:
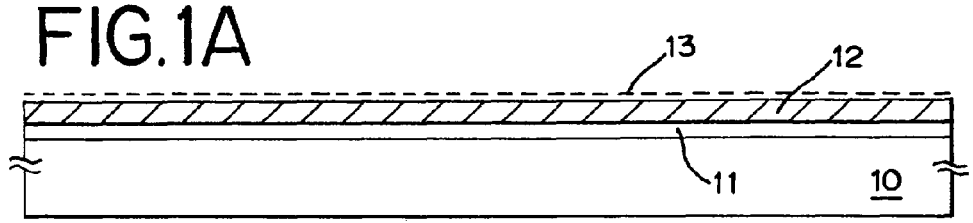
FIGS. 1A to 1E show an embodiment mode of the present invention.

Subsequently, a catalytic element is added to the amorphous silicon film 12 and heat treatment is conducted therefor. An aqueous solution containing the catalytic element (nickel in this embodiment mode) (nickel acetate solution) at 10 ppm in terms of weight is applied onto the amorphous silicon film by a spin coat method to form a layer 13 containing a catalytic element. The catalytic element which is usable here is one kind or plural kinds of elements selected from the group consisting of iron (Fe), nickel (Ni), cobalt (Co), tin (Si), lead (Pb), ruthenium (Ru), Rhodium (Rh), palladium (Pd), osmium (Os), iridium (Ir), platinum (Pt), copper (Co), and gold (Au) (FIG. 1A). Note that the method of adding nickel by the spin coat method is used in this embodiment mode. However, there may be adopted means for forming a thin film made of a catalytic element (nickel film in this embodiment mode) on the amorphous silicon film 12 by an evaporation method, a sputtering method, or the like.

Figure 1B:
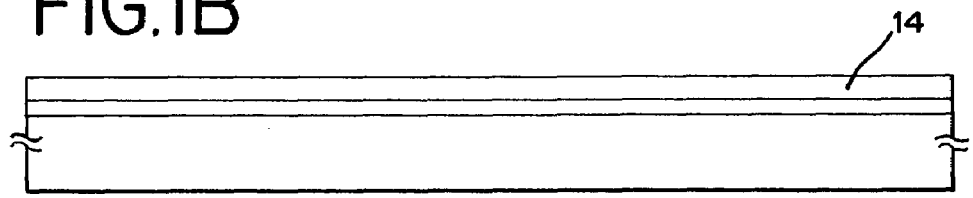

Next, before a crystallization step, a heat treatment step is conducted at 400° C. to 500° C. for about 1 hour to desorb hydrogen from the film, and then heat treatment is conducted at 500° C. to 650° C. (preferably, 550° C. to 570° C.) for 4 hours to 12 hours (preferably, 4 hours to 6 hours). In this embodiment mode, heat treatment is conducted at 500° C. for 4 hours to form a crystalline semiconductor film (crystalline silicon film in this embodiment mode) 14 (FIG. 1B). Note that crystallization is conducted by heat treatment using a furnace in this case. However, the crystallization may be also conducted with a RTA (rapid thermal annealing) apparatus using a lamp or the like as a heat source.

Figure 1C:
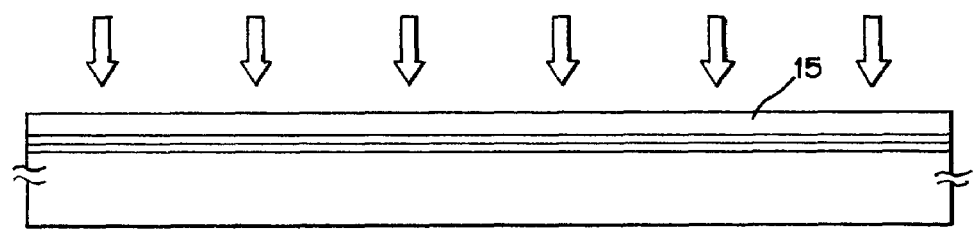

Subsequently, laser light is irradiated to the crystalline silicon film 14 obtained by the heat treatment to form a crystalline silicon film 15 with improved crystallinity (FIG. 1C). By the laser light irradiation, the crystallinity of the crystalline silicon film 15 is greatly improved. A pulse oscillation type KrF excimer laser (248 nm in wavelength) may be applied for the laser light.

Subsequently, the crystalline silicon film is etched in a predetermined shape to form semiconductor layers 16 and 17, and then a gate insulating film 18 covering these semiconductor layers 16 and 17 is formed. Note that, in this specification, semiconductor films which have been separated by etching are called the semiconductor layers. Then, a conductive film 19 is formed on the gate insulating film 18 by using a sputtering method, a CVD method, or the like. For the conductive film, W, Ta, Ti, or Mo which is high melting metal, or an alloy material thereof may be used.

Figure 1D:
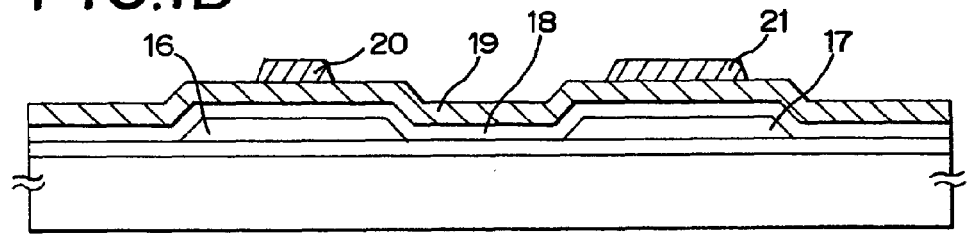

Next, masks 20 and 21 made of resists are formed on the conductive film 19 (FIG. 1D). Note that the masks 20 and 21 are masks for forming gate electrodes. In the present invention, the gate electrode of a p-channel TFT is used as a mask for narrowing a region in which an impurity element for imparting an n-type (hereinafter referred to as an n-type impurity element) is added to the semiconductor layer of the p-channel TFT when an impurity element for imparting a conductivity type is added to the semiconductor layer. Thus, the width of the mask 21 for the p-channel TFT is designed to be larger than that of the mask 20 for an n-channel TFT. Then, the conductive film 19 is etched to form a first-shaped gate electrode 22 and a second-shaped gate electrode 23.

Figure 1E:
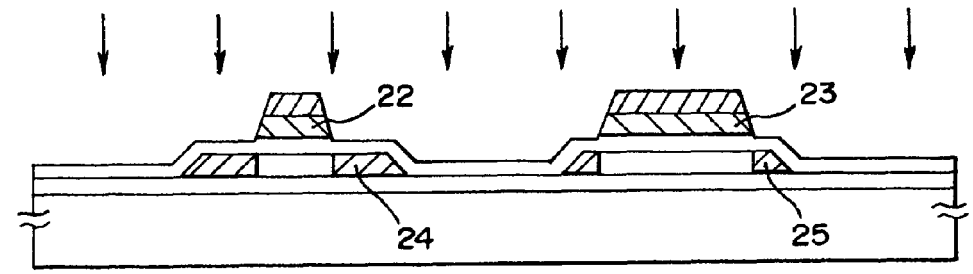

Subsequently, an n-type impurity element is doped (first doping step) to form n-type impurity regions 24 and 25 each containing the n-type impurity element at a concentration of $1 \times 10^{17}/cm^3$ to $1 \times 10^{19}/cm^3$ (FIG. 1E). Note that the impurity element is not added to a region in which the semiconductor layer is overlapped with the first-shaped gate electrode 22 and the second-shaped gate electrode 23, and the region functions as a region in which a channel is formed (hereinafter referred to as a channel forming region).

Figure 2A:
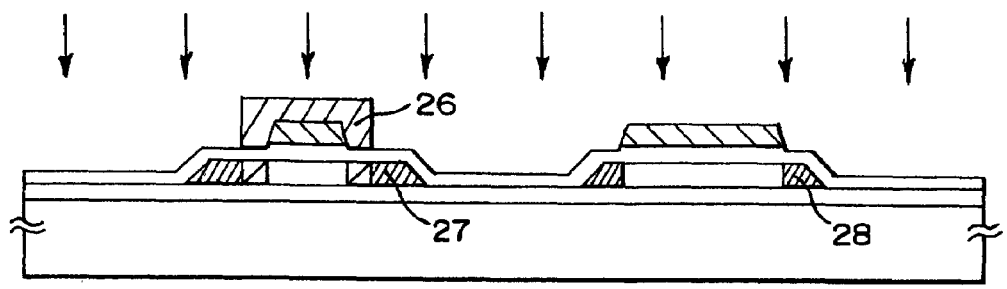
FIGS. 2A to 2C show the embodiment mode of the present invention.

After that, a mask 26 which covers a portion of the semiconductor layer of the n-channel TFT and is made of a resist is formed and an n-type impurity element is doped (second doping step). By the second doping step, n-type impurity regions 27 and 28, each containing the n-type impurity element at a high concentration ($1 \times 10^{19}/cm^3$ to $1 \times 10^{21}/cm^3$), are formed (FIG. 2A). Note that a state in which the impurity element is doped at a low concentration ($1 \times 10^{17}/cm^3$ to $1 \times 10^{19}/cm^3$) is kept in regions of the semiconductor layer of the n-channel TFT which are covered with the mask 26, and the regions function as low concentration impurity (lightly doped drain: LDD) regions.

Subsequently, the mask 26 is removed, and then a mask 29 made of a resist for etching the second-shaped gate electrode 23 of the p-channel TFT in a predetermined shape and a mask 30 made of a resist for forming gettering regions in the semiconductor layer of the n-channel TFT are formed. After that, etching is conducted to form a third-shaped gate electrode 31 with a predetermined shape in the p-channel TFT.

Next, an impurity element for imparting a p-type (hereinafter referred to as a p-type impurity element) is doped to form gettering regions 32 in the semiconductor layer of the n-channel TFT and a source region and a drain region 33 and gettering regions 34 in the semiconductor layer of the p-channel TFT.

Figure 2B:
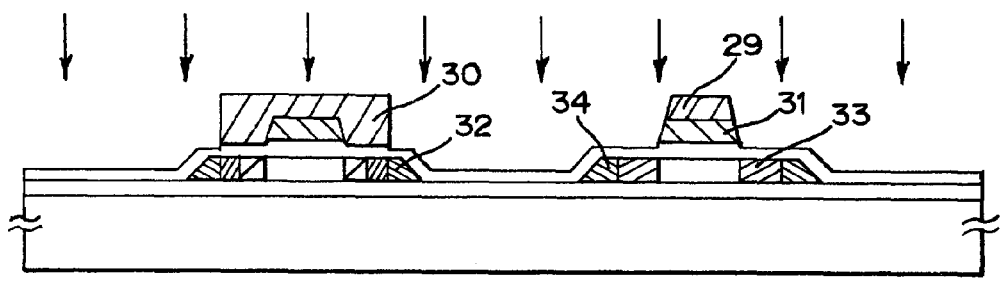

After the formation of the gettering regions 32 and 34, heat treatment is conducted for moving the catalytic elements left in the semiconductor layers to the gettering regions 32 and 34 (FIG. 2B).

By the heat treatment, the catalytic elements left in the channel forming region of the semiconductor layer and a junction portion between the channel forming region and the source region or the drain region can be moved to the gettering regions so that the occurrence of a leak current resulting from the segregation of the catalytic elements can be suppressed.

In the n-channel TFT and the p-channel TFT, the concentration of the n-type impurity element and the concentration of the p-type impurity element in the gettering region of the semiconductor layer are equal to each other so that the gettering efficiencies can be made equal. In addition, counter doping is not conducted for a region which becomes the source region or the drain region in the semiconductor layer of the p-channel TFT. Thus, a problem in that the resistance increases in the source region or the drain region of the P-channel TFT can be solved. Note that the catalytic elements are moved to the gettering regions by the gettering processing step so that the concentration of the catalytic elements becomes $1 \times 10^{19}/cm^3$ or higher.

Figure 2C:
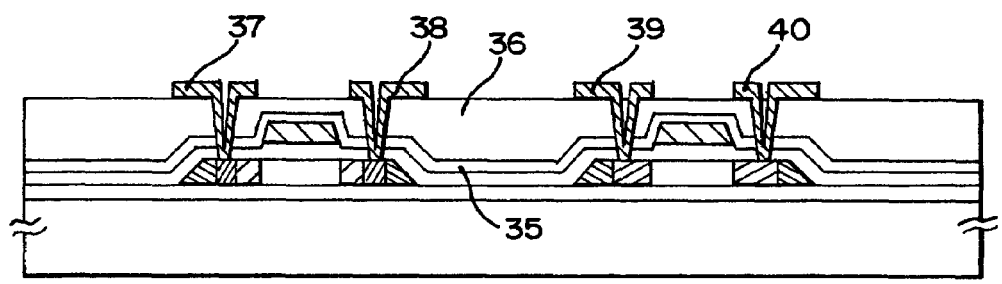

The masks 29 and 30 are then removed to form an interlayer insulating film 35. Next, an interlayer insulating film 36 is formed on the interlayer insulating film 35, and then wiring lines 37 to 40 electrically connected to the impurity regions are formed (FIG. 2C)

Note that, in this embodiment mode, the n-type impurity element is first doped to the semiconductor layer. However, the order of steps is not limited to that in this embodiment mode but may be determined as appropriate by an operator.

[Embodiment 1]

An embodiment of the present invention will be described with reference to FIGS. 3 to 5 and 11. Here, a detailed description is given step by step on a method of manufacturing, on the same substrate, a pixel TFT for a pixel portion and TFTs for a driving circuit provided in the periphery of the pixel portion.

In FIG. 3A, a low alkaline glass substrate or a quartz substrate may be used for a substrate 100. This embodiment employs a low alkaline glass substrate. In this case, the substrate may be subjected to heat treatment at a temperature 10 to 20° C. lower than the glass distortion point. On a surface of the substrate 100 on which the TFTs are to be formed is covered with a base film 101 in order to prevent diffusion of impurities from the substrate 100. The base film may be a silicon oxide film, a silicon nitride film, a silicon oxynitride film, or the like. For instance, the base film may be a laminate of a silicon oxynitride film 101a formed from $SiH_4$, $NH_3$, and $N_2O$ by plasma CVD method to a thickness of 100 nm and a silicon oxynitride film 101b formed from $SiH_4$ and $N_2O$ by the plasma CVD method to a thickness of 200 nm.

Next, a semiconductor film having an amorphous structure is formed to a thickness of 20 to 150 nm (preferably 30 to 80 nm) by a known method such as the plasma CVD method or a sputtering method. In this embodiment, an amorphous silicon film with a thickness of 55 nm is formed by the plasma CVD. Other semiconductor films having an amorphous structure include amorphous semiconductor films or microcrystalline semiconductor films. The base film 101 and the amorphous silicon film can be formed by the same film formation method and the two may be formed successively. The surface of the base film is prevented from being contaminated if exposure to the air is avoided after the formation of the base film. Accordingly, fluctuation in characteristic and threshold voltage of the TFTs manufactured can be reduced.

A semiconductor film having a crystal structure (a crystalline silicon film, in this embodiment) is then formed in accordance with the technique disclosed in Japanese Patent Application Laid-open No. Hei 7-130652. The technique described in the publication is a crystallization method that uses a catalytic element for promoting crystallization (one or more kinds of elements selected from the group consisting of Ni, Co, Sn, Pb, Pd, Fe, and Cu, typically, Ni) in crystallizing the amorphous silicon film.

Specifically, the amorphous silicon film is subjected to heat treatment while the catalytic element is held to the surface of the amorphous silicon film to change it into a crystalline silicon film. This embodiment employs the method described in Embodiment 1 of the publication but the method of Embodiment 2 in the same publication may be used instead. Although crystalline silicon films include a so-called single crystal silicon film and a polysilicon film, the crystalline silicon film formed in this embodiment is a silicon film having crystal grain boundaries.

In adding the amorphous silicon film with the catalytic element, a vapor-phase method such as a plasma doping method, a vapor deposition method and a sputtering method can be employed. Alternatively, a method of applying a solution containing a catalytic element may be employed. The method using the solution is easy to control the dose of the catalytic element, so that adding of a minute amount of the catalytic element can easily be made.

The crystallinity of the crystalline semiconductor film can be improved further by using the crystallization method described above in combination with a laser crystallization method. A laser usable in this case is a pulse oscillation type or continuous luminous type KrF excimer laser, XeCl excimer laser, YAG laser, or $YVO_4$ laser. Laser light emitted from a laser oscillator as those given in the above is collected into a linear beam by an optical system before irradiating the semiconductor film. Conditions for crystallization are suitably set by an operator.

When the amorphous silicon film is crystallized, rearrangement of atoms takes place to densify the film. Therefore the crystalline silicon film obtained has a thickness smaller than the original thickness of the amorphous silicon film (55 nm, in this embodiment) by about 1 to 15%.

The crystalline silicon film is then divided into island-like semiconductor layers 102 to 105.

At this point, the entire surface of the island-like semiconductor layers 102 to 105 for forming the n-channel TFT may be added with boron (B) as an impurity element for imparting the p-type conductivity in a concentration of $1 \times 10^{16}$ to $5 \times 10^{17}$ atoms/cm$^3$ in order to control the threshold voltage. The boron (B) adding may be carried out by ion doping, and it may be conducted while the amorphous silicon film is being formed. The boron (B) adding at this point is not always necessary but the semiconductor layers 102 to 105 are preferably added with boron (B) in order to contain the threshold voltage in the n-channel TFT in a predetermined range.

A gate insulating film 106 with a thickness of 10 to 150 nm is formed next by the plasma CVD method or a sputtering method from an insulating film containing silicon. For example, a silicon oxynitride film is formed to a thickness of 120 nm. The gate insulating film 106 may be a single layer or a laminate of other insulating films containing silicon.

Formed next are a conductive film (A) 107 and a conductive film (B) 108 for forming gate electrodes. In this embodiment, the conductive film (A) 107 is a conductive metal nitride film and the conductive film (B) 108 is a metal film. The film (B) is laid on the film (A) to form a laminate. The conductive film (B) 108 comprises an element selected from the group consisting of tantalum (Ta), titanium (Ti), molybdenum (Mo), and tungsten (W), or an alloy containing one of the above elements as its main ingredient, or an alloy film containing a combination of the above elements (typically, a Mo—W alloy film or a Mo—Ta alloy film). The conductive film (A) 107 comprises at least one of tantalum nitride (TaN), tungsten nitride (WN), titanium nitride (TiN), and molybdenum nitride (MoN). Alternatively, the conductive film (A) 107 may be formed of tungsten silicide, titanium silicide, or molybdenum silicide. The conductive film (B) 108 preferably contains impurities in low concentration in order to lower its resistivity. In particular, the oxygen concentration thereof is preferably 30 ppm or less. For example, a tungsten (W) film containing 30 ppm or less oxygen can have a specific resistivity of 20 μΩcm or lower.

The thickness of the conductive film (A) 107 is set to 10 to 50 nm (preferably 20 to 30 nm) whereas the thickness of the conductive film (B) 108 is set to 200 to 400 nm (preferably 250 to 350 nm). In this embodiment, a tantalum nitride film with a thickness of 30 nm is used for the conductive film (A) 107 while a Ta film with a thickness of 350 nm is used for the conductive film (B) 108, and both films are formed by the sputtering method. In forming a film by the sputtering method, an appropriate amount of Xe and Kr added to the sputtering gas of Ar can ease the internal stress of the film to be formed and thus prevent the film from peeling off (FIG. 3A).

Masks 109 to 112 are then formed from a resist and first etching treatment is conducted to form gate electrodes and capacitance wiring lines of the respective TFTs. In this embodiment, first etching conditions include employing ICP (inductively coupled plasma) etching, choosing $CF_4$, $Cl_2$, and $O_2$ as etching gas, setting the gas flow rate ratio thereof to 25/25/10 sccm, and giving an RF (13.56 MHz) power of 500 W to a coiled electrode at a pressure of 1 Pa to generate plasma. The substrate side (sample stage) also receives an RF (13.56 MHz) power of 150 W so that a substantially negative self-bias voltage is applied. A W film is etched under these first etching conditions to taper first conductive layers around the edges.

Then, the etching conditions are changed without removing the masks 109 to 112. The etching conditions include using $CF_4$ and $Cl_2$ as etching gas, setting the gas flow rate ratio thereof to 30/30 sccm, and giving an RF (13.56 MHz) power of 500 W to a coiled electrode at a pressure of 1 Pa to generate plasma for thirty second etching. The substrate side (sample stage) also receives an RF (13.56 MHz) power of 20 W so that a substantially negative self-bias voltage is applied. Under the etching conditions using the mixture of $CF_4$ and $Cl_2$, the W film and the TaN film are etched to the same degree. Through the above steps, gate electrodes 113, 114 and 115, and a capacitance wiring line 116 are formed from the conductive film (A) and the conductive film (B) which are tapered around the edges. Note that, in a step of adding an n-type impurity element, the p-channel TFT 114 is used as a mask in order to be larger in size than a region of a semiconductor layer of a p-channel TFT in which an n-type impurity element is added. Therefore, it is important that the p-channel TFT 114 is formed larger in width than the gate electrode 113 of the n-channel TFT and the gate electrode 115 of the pixel TFT. Further, it is important that the mask 110 is made larger in width that the other masks.

Still leaving the masks 109 to 112 in place, the n-type impurity element adding step is conducted to form an impurity region 118 (FIG. 3B). Phosphorus (P) or arsenic (As) may be used for the n-type impurity element. Here, ion doping using phosphine ($PH_3$) is employed in order to add the region with phosphorus (P).

Then second etching treatment is conducted without removing the masks 109 to 112. In the second etching treatment, $CF_4$, $Cl_2$, and $O_2$ are used as etching gas, the gas flow rate ratio thereof is set to 20/20/20 sccm, and an RF (13.56 MHz) power of 500 W is supplied to a coiled electrode at a pressure of 1 Pa to apply a substantially negative self-bias voltage. The W film is selectively etched in the second etching treatment.

Figure 4A:
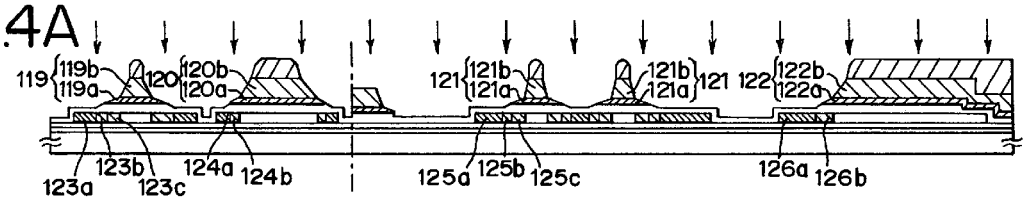
FIGS. 4A and 4D show the embodiment of the present invention.

Through the second etching treatment, conductive films (A) 113a to 116a and conductive films (B) 113b to 116b are etched to form gate electrodes 119, 120 and 121, and a capacitance wiring line 122 (FIG. 4A). The gate electrodes 119 and 121 of a region to be an n-channel TFT are formed smaller in width than the gate electrode 120 of the p-channel TFT. This is because the gate electrode 120 of the p-channel TFT is used as a mask for making a region containing high concentration n-type impurity elements small in size. Therefore, the gate electrode 120 of the p-channel TFT is made lager in width than the predetermined shapes (of the other gate electrodes 119 and 121). Through this step, the gate electrodes 119 and 121 of the n-channel TFT and the capacitance wiring line 122 may be referred to as a first shape gate electrodes and a first shape capacitance wiring line, respectively. Further, the gate electrode 120 of the p-channel TFT may be referred to as a second shape gate electrode.

Next, the semiconductor layer is added with an n-type impurity element. Using as masks gate electrodes 119, 120, and 121 that are formed by the second etching treatment, the semiconductor layers below the tapered portions of the conductive films (A) are also added with an n-type impurity element. As a result, n-type impurity regions (A) 123a to 126a and n-type impurity regions (B) 123b to 126b are formed. The impurity (phosphorus (P)) concentration in the impurity regions 123a to 126a formed here is set to $1 \times 10^{20}$ to $1 \times 10^{21}$ atoms/cm$^3$ (in this specification, the concentration of the n-type impurity element contained in the n-type impurity regions 123a to 126a is expressed as (n$^+$)). The impurity concentration in the n-type impurity regions (B) 123b to 126b may be set to $5 \times 10^{17}$ to $5 \times 10^{19}$ atoms/cm$^3$. In this specification, the concentration of the n-type impurity element contained in the n-type impurity regions 123b to 126b is expressed as (n$^-$). The impurity concentration is slightly low in the n-type impurity region 123c that overlaps the tapered portions of the conductive layer (A) 119a, but it has almost the same concentration as the n-type impurity region 123b (FIG. 4A).

Figure 4B:
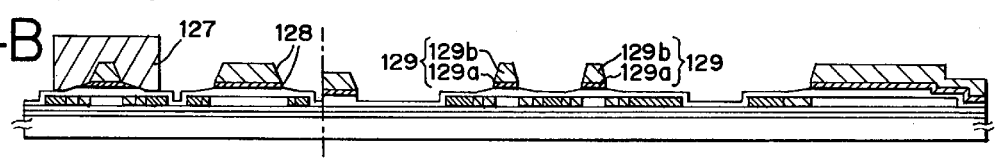

The resist masks 109 to 112 are removed and then a mask 127 is newly formed from a resist to cover the n channel TFT for third etching treatment. In the third etching treatment, SF$_6$ and Cl$_2$ are used as etching gas, the gas flow rate ratio thereof is set to 50/10 sccm, and an RF (13.56 MHz) power of 500 W is given to a coiled electrode at a pressure of 1.3 Pa to generate plasma for thirty second etching. The substrate side (sample stage) receives an RF (13.56 MHz) power of 10 W so that a substantially negative self-bias voltage is applied. Through the above steps, the conductive films (A) 120a and 121a are etched to form a gate electrode 128 of the p-channel TFT and gate electrodes 129 of the pixel TFT (FIG. 4B).

Figure 4C:
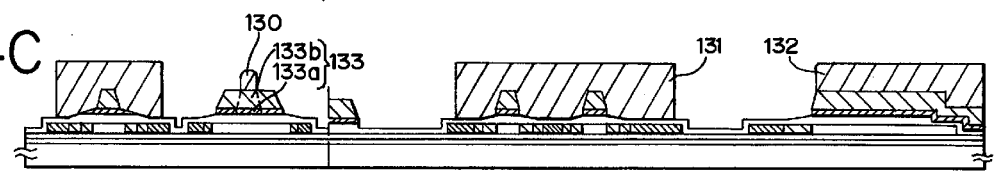

Formed next are a mask 130 made form a resist for etching the gate electrode 128 of the p-channel TFT in a predetermined shape, a mask 131 comprising a resist which is partially exposing the semiconductor layer of the pixel TFT, and a mask 132 comprising a resist covering the capacitance wiring line. The gate electrode 128 of the p-channel TFT is etched, thereby obtaining a gate electrode 133 of the p-channel TFT (FIG. 4C). The gate electrode 133 formed through this step is also referred to as a third shape gate electrode. Further the gate electrode 129 of a TFT in the pixel portion (a pixel TFT) may be referred to as a forth shape gate electrode.

The semiconductor layer is then added with a p-type impurity element (boron (B), in this embodiment) to form p-type impurity regions 134 to 139. In the p-type impurity regions 134, 135, 137 and 138, the p-type impurity elements are added in a concentration of $1 \times 10^{20}$ to $1 \times 10^{21}$ atoms/cm$^3$, respectively. Also, the p-type impurity regions 136 and 139 each contain the p-type impurity elements in a concentration of $1 \times 10^{17}$ to $1 \times 10^{19}$ atoms/cm$^3$. A region 135a in which n-type impurity elements and p-type impurity elements are added at high concentration and a region 135b in which only p-type impurity elements are added at high concentration are formed in the semiconductor layer of the p-channel TFT since the semiconductor layer of the p-channel TFT in the driver circuit includes a region 124a in which n-type impurity elements are added at high concentration. In this embodiment, boron (B) is added in a region in which the TaN film is removed before boron (B) adding is performed on the semiconductor layer of the p-channel TFT. Therefore the semiconductor layer can be added with boron (B) at a low acceleration to damage the layer less upon adding.

Figure 4D:
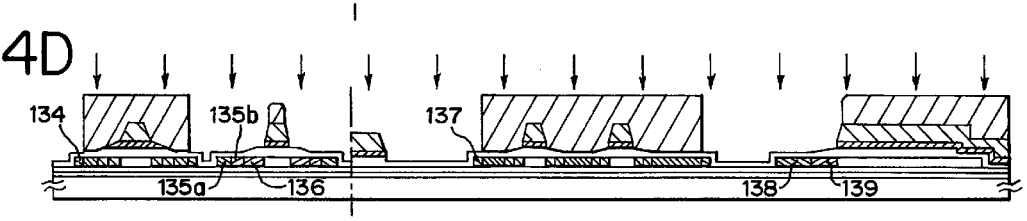

Through the above steps, the n-type impurity regions and the p-type impurity regions are formed in the relevant semiconductor regions (FIG. 4D).

Figure 5A:
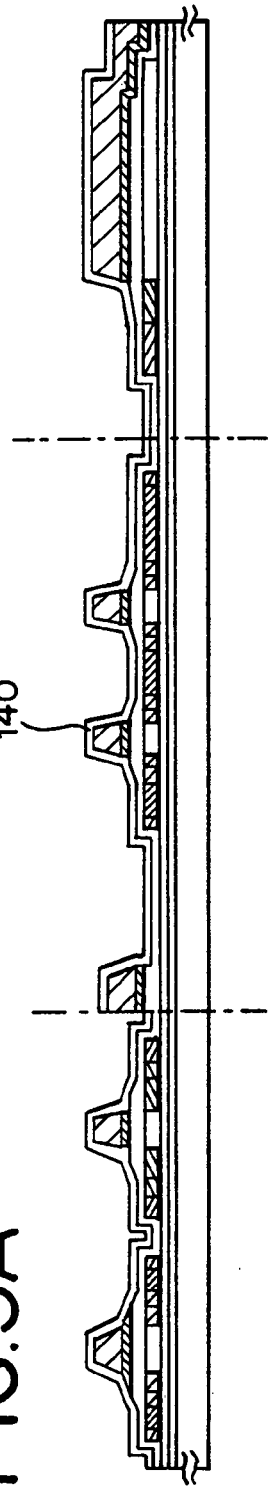
FIGS. 5A and 5B show the embodiment of the present invention.

The masks 130 to 132 are then removed to form an inorganic interlayer insulating film 140 (FIG. 5A). A silicon nitride film, a silicon oxide film, or a silicon oxynitride film with a thickness of 50 to 500 nm (typically 100 to 300 nm) is used. In this embodiment, a silicon oxynitride film is formed by the plasma CVD method at a thickness of 150 nm. The inorganic interlayer insulating film is not limited to the silicon oxynitride film, of course, and it may be a single layer or a laminate of other insulating films containing silicon.

Next, the impurity elements that have been used to add the semiconductor layers are activated. This activation step employs an annealing furnace. Thermal annealing is conducted in a nitrogen atmosphere with oxygen concentration set to 1 ppm or less, preferably 0.1 ppm or less, at 400 to 700° C., typically 500 to 550° C. In this embodiment, the impurity elements are activated through heat treatment at 550° C. for four hours. Other than thermal annealing, laser annealing or rapid thermal annealing (RTA) can be used.

Note that the catalytic elements contained in the gettering region are in a concentration of $1 \times 10^{19}$ atoms/cm$^3$ or more because the catalytic elements are moved to the gettering region through the gettering-processing step.

At the same time the above activation treatment is conducted, this embodiment carries out gettering of the catalytic elements used as a catalyst in crystallization so that the catalytic elements move to the n-type impurity regions containing phosphorus in high concentration and the amount of remaining catalytic element is reduced. The concentration of phosphorus (P) required for gettering is about the same as the concentration in the impurity regions (n$^+$) formed in FIG. 4B. The heat treatment for the activation step is also capable of gettering the catalytic elements to remove them from the channel forming regions of the n-channel TFT and the p-channel TFT. Mostly, an obtained TFT has a reduced OFF current value and excellent crystallinity, and therefore high field effect mobility is obtained and excellent characteristics are attained.

Alternatively, the activation treatment may be conducted before the inorganic interlayer insulating film 140 is formed. However, if the material used for the gate electrodes is weak against heat, the activation treatment is desirably preceded by formation of an interlayer insulating film (an insulating film mainly containing silicon, a silicon nitride film, for example) for protecting wiring line and the like as in this embodiment.

Another heat treatment is conducted in an atmosphere containing 3 to 100% hydrogen at 300 to 550° C. for one to twelve hours, thereby hydrogenating the semiconductor layers. In this embodiment, the substrate is subjected to heat treatment in a nitrogen atmosphere containing about 3% of hydrogen at 410° C. for an hour. This step is to terminate dangling bonds in the semiconductor layers by hydrogen contained in the interlayer insulating film. Other hydrogenation methods include plasma hydrogenation (using hydrogen excited by plasma).

If laser annealing is used for the activation treatment, it is desirable to conduct the hydrogenation first and then irradiation of laser light from an excimer laser, a YAG laser, and the like.

Next, an organic interlayer insulating film 141 is formed on the inorganic interlayer insulating film 140 from an organic insulating material. In this embodiment, an acrylic resin film with a thickness of 1.6 μm is formed. Contact holes reaching the respective impurity regions are then formed by patterning.

Thereafter, a transparent conductive film with a thickness of 80 to 120 nm is formed and patterned to form a pixel electrode 142. Examples of a suitable material for the transparent conductive film include an indium oxide-zinc oxide alloy ($In_2O_3$—ZnO) and zinc oxide (ZnO). Zinc oxide added with gallium (Ga) (ZnO:Ga) in order to enhance the visible light transmittance or the conductivity may also be used for the transparent conductive film.

In a driving circuit portion 205, wiring lines 143 and 144 electrically connected to the impurity regions are formed. These electrodes are formed by patterning a laminate of a Ti film with a thickness of 50 nm and an alloy (alloy of Al and Ti) film with a thickness of 500 nm.

In a pixel portion 206, wiring lines 146 to 149 are formed and brought into contact with the impurity regions.

Figure 5B:
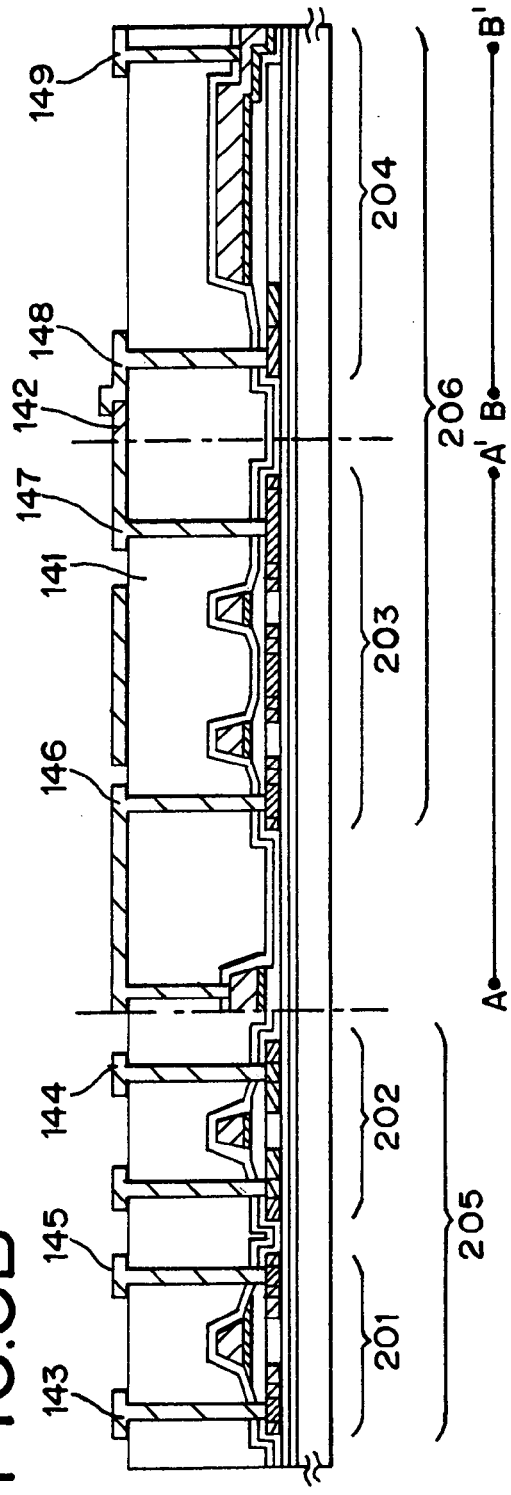

The pixel electrode 142 is electrically connected to a semiconductor layer 105 that functions as one of electrodes of a storage capacitor via a wiring 148 (FIG. 5B).

Although the pixel electrode 142 shown in this embodiment comprises a transparent conductive film, a conductive material having reflectivity may be used to form the pixel electrode. Then a reflective display device is obtained. In this case, the pixel electrode can be formed at the same time the other electrodes are formed. A desirable material of the pixel electrode for the pixel electrode is a highly reflective material such as a film mainly containing Al or Ag, or a laminate of an Al film and an Ag film.

In this way, the TFTs for the driving circuit and the pixel TFT for the pixel portion can be formed on the same substrate. The driving circuit has an n-channel TFT 201 and a p-channel TFT 202. The pixel portion has a pixel TFT 203 and a storage capacitor 204. A substrate as this is herein referred to as an active matrix substrate for the sake of conveniences.

Figure 11:
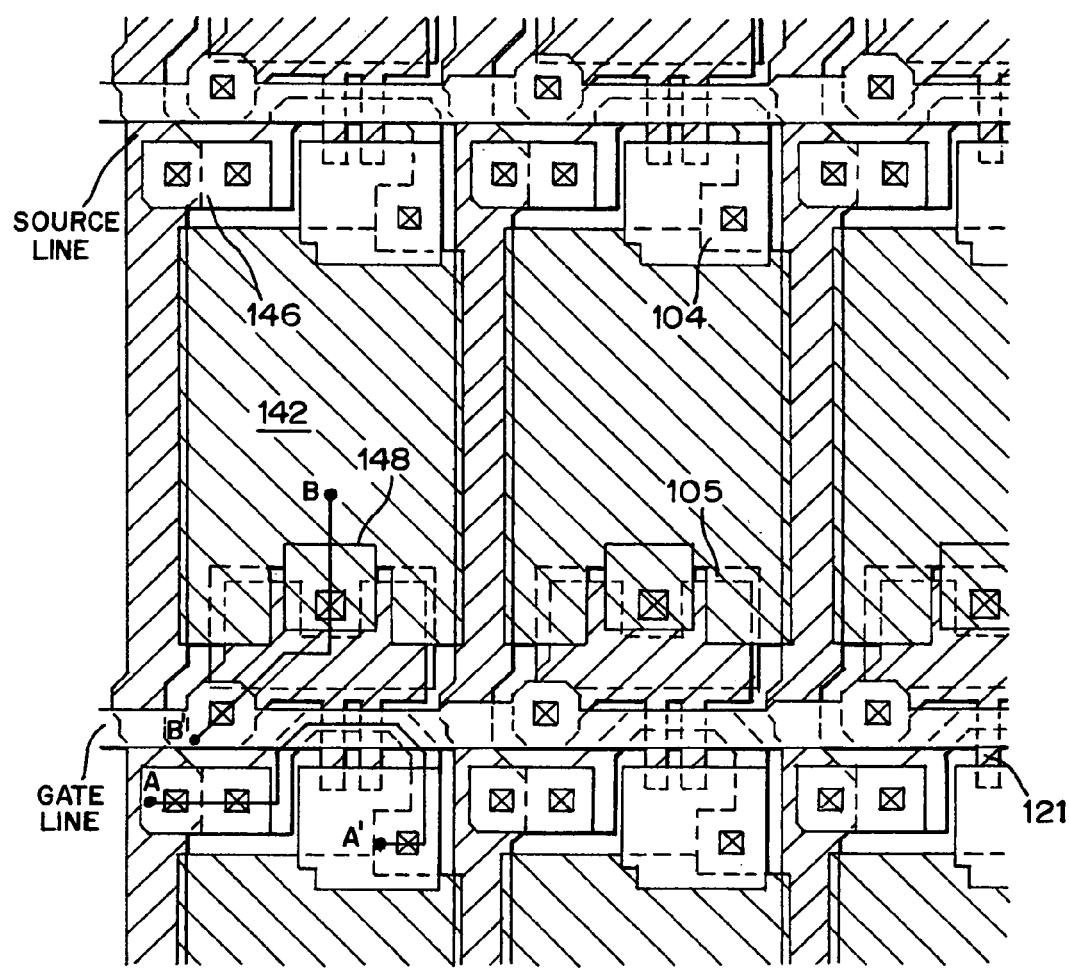
FIG. 11 shows an embodiment of the present invention.

The top view of the active matrix substrate is show in FIG. 11. Note that a line A–A' in FIG. 11 corresponds a line A–A' in FIG. 5B and a semiconductor layer 104, a gate electrode 121, a wiring 146, a gate wirings and source wirings are formed thereon. Similarly, a line B–B' in FIG. 11 corresponds a line B–B' in FIG. 5B, and a semiconductor layer 105, a pixel electrode 142 and a wiring 148 are formed thereon.

The n-channel TFT 201 of the driving circuit has, in the island-like semiconductor layer 102, a channel forming region; a source region or a drain region 123*a*; an impurity region 123*b*; an impurity region 123*c* overlapping the second shape gate electrode 119 (hereinafter an impurity region overlapping a gate electrode is denoted by Lov); and an impurity region 134 to be a gettering region added with n-type impurity elements and p-type impurity elements at high concentration. The length of the Lov region in the channel length direction is set to 0.5 to 3.0 μm, preferably 1.0 to 1.5 μm. The n-channel TFT 201 also has the first shape gate electrode 119 that is formed from the laminate of the conductive film (A) 119*a* and the conductive film (B) 119*b*.

The p-channel TFT 202 of the driving circuit has, in the island-like semiconductor layer 103, a channel forming region; a source region or a drain region 135*b*; an impurity region 136; and an impurity region 135*a* to be a gettering region added with n-type impurity elements and p-type impurity elements at high concentration. The p-channel TFT 202 also has the third shape gate electrode 133 that is formed from the laminate of the conductive film (A) 1303*a* and the conductive film (B) 133*b*.

The pixel TFT 203 of the pixel portion has, in the island-like semiconductor layer 104, a channel forming region; a source region or a drain region 125*a*; and impurity regions 125*b* and 125*c*. The pixel TFT 203 also has the fourth shape gate electrode 129 that is formed from the laminate of the conductive film (A) 129*a* and the conductive film (B) 129*b*.

The storage capacitor 204 is comprised of: the capacitance wiring line 122; an insulating film formed from the same material as the gate insulating film; and the semiconductor layer 105 added with a p-type impurity element. The pixel TFT 203 in FIGS. 5A and 5B has a double gate structure but it may take a single gate structure or a multigate structure in which a plurality of gate electrodes are provided.

As described above, the present invention can improve the operation performance and the reliability of a semiconductor device by individually optimizing the structure of TFTs that constitute a pixel TFT and a driving circuit in accordance with specifications required in these circuits. Furthermore, gate electrodes are formed from a heat resistant conductive material to facilitate activation of LDD regions, source regions, and drain regions, and wiring lines are formed from a low resistivity material to lower the wiring resistance satisfactorily. Therefore the invention can also be applied to a display device having a 4 inch or larger pixel portion (screen size).

[Embodiment 2]

Figure 6:
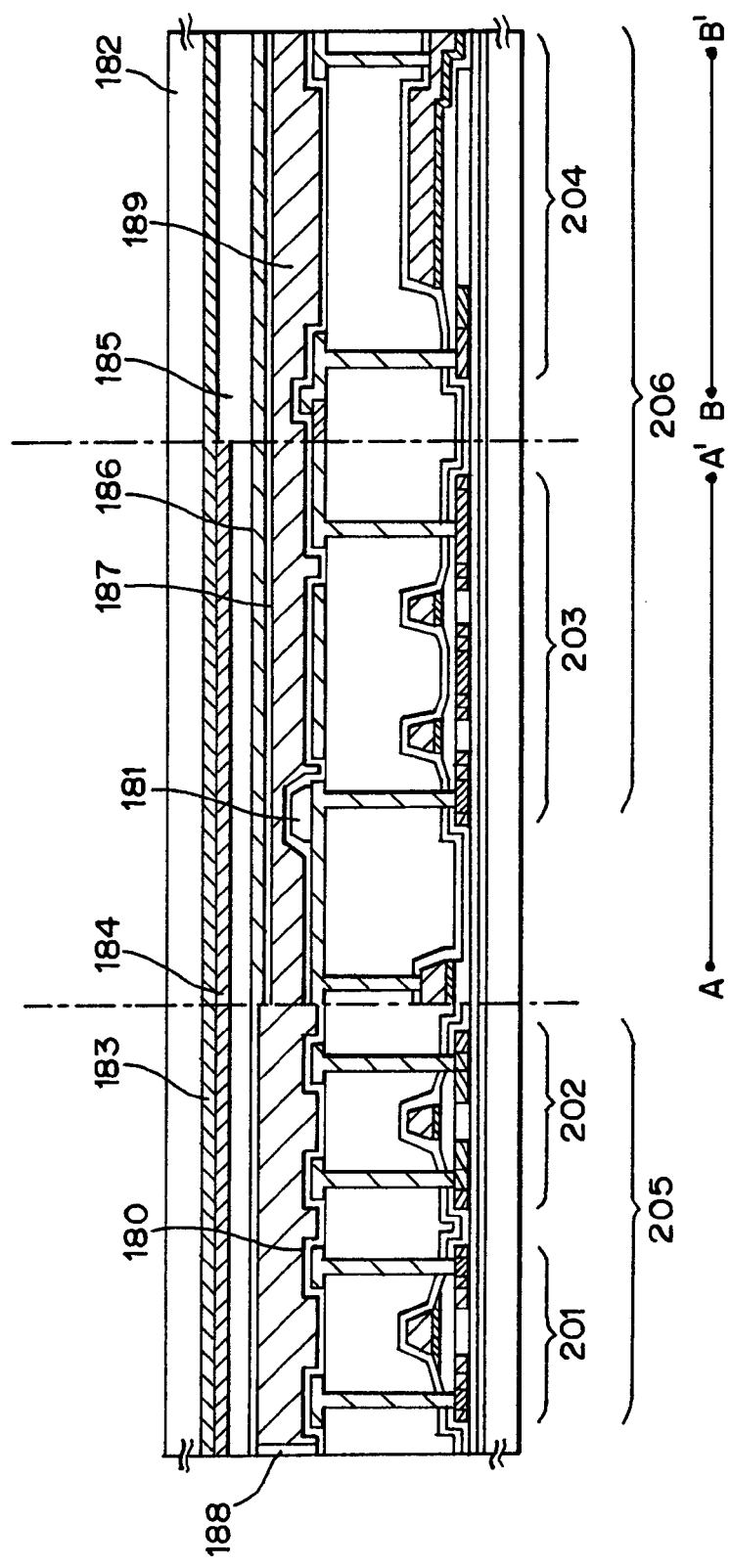
FIG. 6 shows an embodiment of the present invention.

In this embodiment, a process of manufacturing an active matrix liquid crystal display device (also referred to as a liquid crystal display panel) from the active matrix substrate manufactured in Embodiment 1 is described below. FIG. 6 is used for explanation.

First, in accordance with Embodiment 1, the active matrix substrate in a state shown in FIG. 5B is obtained, and thereafter, an alignment film 180 is formed on the active matrix substrate of FIG. 5B, and is subjected to a rubbing process. Note that, in this embodiment, before the formation of the alignment film 180, a columnar spacer 181 for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 182 is prepared. On the opposing substrate 182, there are formed a colored layers 183, 184, and the leveling film 185. Further, the second light shielding portion is formed by overlapping a part of the red color layer 183 and the blue color layer 184. Further, not shown in FIG. 6, the first light shielding portion is formed by overlapping a part of the red color layer and the green color layer.

Next, in the pixel portion an opposing electrode 186 is formed, an alignment film 187 is formed on the entire surface of the opposing substrate, and a rubbing process is conducted thereon.

Then, the active matrix substrate on which a pixel portion and a driving circuit are formed is stuck with the opposing substrate by a sealing agent 188. A filler is mixed in the sealing agent 188, and the two substrates are stuck with each other while keeping a uniform gap by this filler and the columnar spacer. Thereafter, a liquid crystal material 189 is injected between both the substrates to encapsulate the substrates completely by an encapsulant (not shown). A known liquid crystal material may be used as the liquid crystal material 189. Thus, the active matrix liquid crystal display device shown in FIG. 6 is completed. Then, if necessary, the active matrix substrate and the opposing substrate are parted into desired shapes. In addition, by using a known technique, a polarizing plate or the like may be suitably provided. Then, an FPC is stuck with the substrate using a known technique.

Figure 7A:
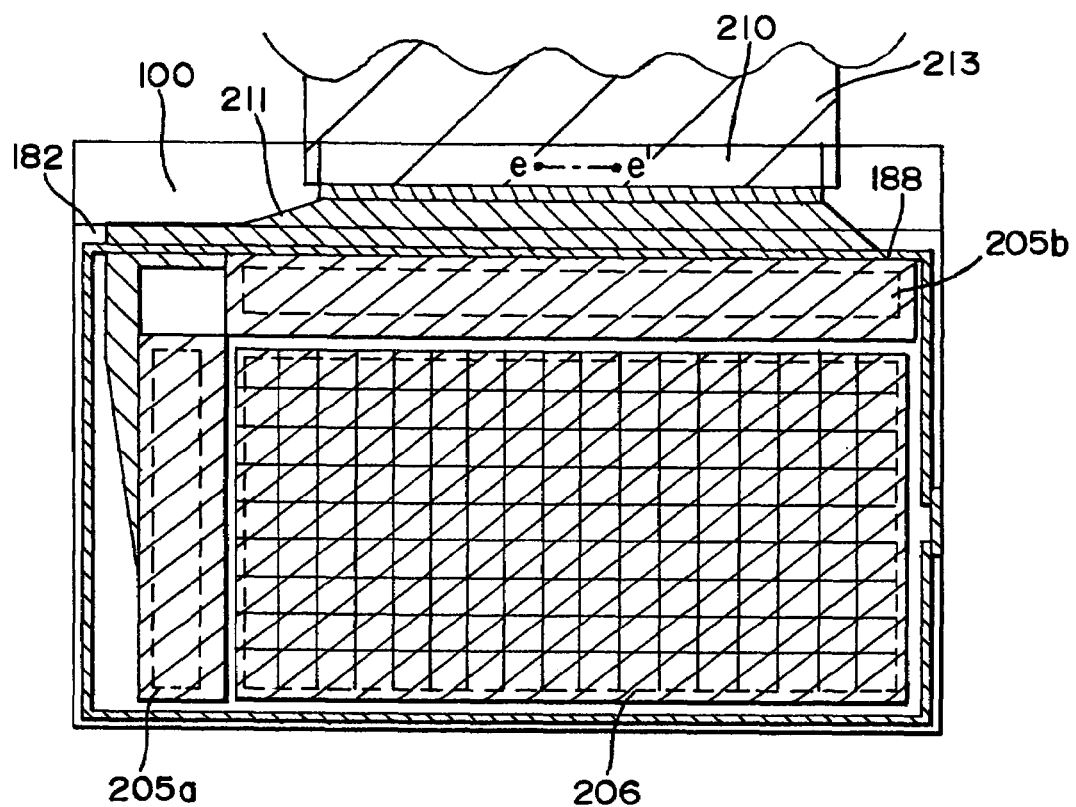
FIGS. 7A and 7B show an embodiment of the present invention.
Figure 7B:
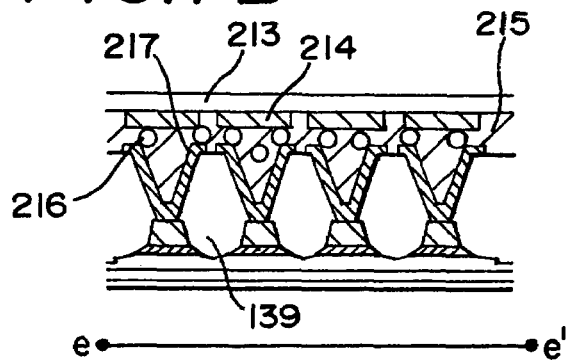

The structure of the liquid crystal display panel obtained in this way is described using the top view of FIG. 7A. In FIGS. 7A and 7B, the same symbols are used for the parts corresponding to those in FIG. 6.

In the top view shown in FIG. 7A, the active matrix substrate provided with the substrate 100, the pixel portion 206, the driving circuits 205a and 205b, an external input terminal 210 for adhering the FPC (flexible printed circuit) 213, a connection wiring 211 connecting the external input terminal to the input portion of each circuit, and the like, and the opposing substrate 182 provided with color filters and the like are adhered by the sealing agent 188.

FIG. 7B is a cross sectional view of the external input terminal 210 shown in FIG. 7A along the line e–e'. Further, in the external input terminal, FPC formed by a base film 213 and a wiring 214 are adhered through an anisotropic conductive resin 215. Further the mechanical strength is increased by a reinforcing plate. The reference numeral 217 is a wiring from a conductive film which is deposited to form the pixel electrode 140. Since the outer diameter of the conductive particle 216 is smaller than the pitch of a wiring 217, if an appropriate amount of conductive particle 216 are dispersed in the adhesive agent 215, short circuit does not occur with the adjacent wirings, and an electrical connection with a corresponding wiring on the FPC side may be formed.

The liquid crystal display panel formed as described above may be used as a display portion of various electric equipment.

[Embodiment 3]

FIG. 8 is a block diagram of a semiconductor device manufactured in accordance with the present invention. Shown in FIG. 8 is the circuit structure for analog driving. This embodiment describes a semiconductor device having a source side driving circuit 90, a pixel portion 91, and a gate side driving circuit 92. In this specification, the term driving circuit generically refers to a source side driving circuit and a gate side driving circuit.

The source side driving circuit 90 is provided with a shift register 90a, a buffer 90b, and a sampling circuit (transfer gate) 90c. The gate side driving circuit 92 is provided with a shift register 92a, a level shifter 92b, and a buffer 92c. A level shifter circuit may be provided between the sampling circuit and the shift register if necessary.

In this embodiment, the pixel portion 91 is composed of a plurality of pixels and each of the plural pixels has a TFT element.

Though not shown in the drawing, another gate side driving circuit may be provided across the pixel portion 91 from the gate side driving circuit 92.

If the semiconductor device is digitally driven, the sampling circuit may be replaced by a latch (A) 93b and a latch (B) 93c as shown in FIG. 9. A source side driving circuit 93 has a shift register 93a, the latch (A) 93b, the latch (B) 93c, a D/A converter 93d, and a buffer 93e. A gate side driving circuit 95 has a shift register 95a, a level shifter 95b, and a buffer 95c. A level shifter circuit may be provided between the latch (B) 93c and the D/A converter 93d if necessary.

The above structure can be obtained by the manufacture process shown in Embodiment 1. Although only structures of the pixel portion and the driving circuit are described in this embodiment, a manufacture process according to the present invention can form a memory and a microprocessor as well.

[Embodiment 4]

In Embodiment 4, a crystallization method different from those in Embodiment Mode and Embodiment 1 will be described.

First, on a substrate (glass substrate in Embodiment 4) 50, an insulating base film 51 formed of a silicon oxynitride film with a thickness of 200 nm and an amorphous semiconductor film (amorphous silicon film in Embodiment 4) 52 with a thickness of 200 nm are formed. This process is alterable in such a way that the base insulating film and amorphous semiconductor film are formed continuously without being exposed to the atmospheric air.

Figure 10A:
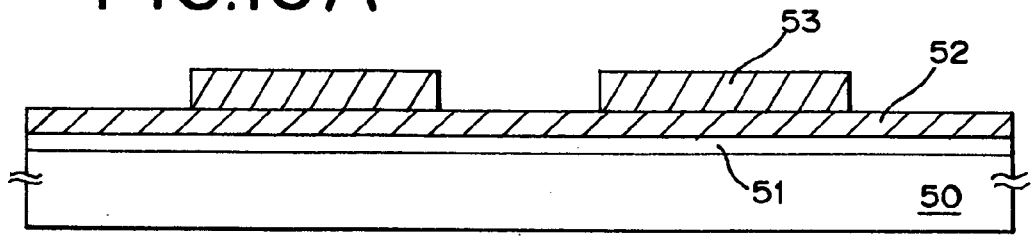
FIGS. 10A to 10D show an embodiment of the present invention.

Next, an insulating mask film 53 of a silicon oxide film is formed to have a thickness of 200 nm. The insulating mask film has an opening portion for adding a catalytic element to the semiconductor film (FIG. 10A).

Figure 10B:
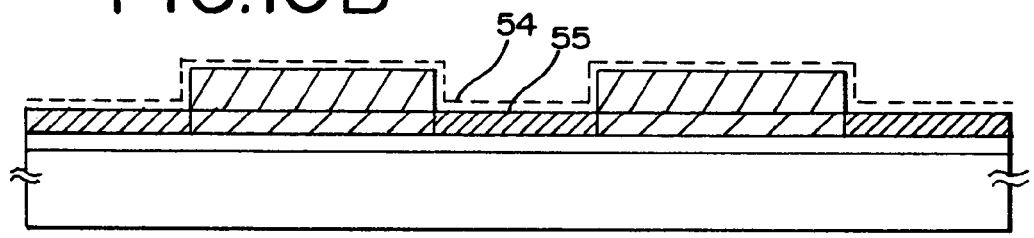

Next, an aqueous solution (nickel acetate water solution) containing 100 ppm by weight of catalytic element (nickel in Embodiment 4) is applied by spin coating method to form a catalytic element-containing layer 54. At this time, the catalytic element-containing layer 54 is selectively brought into contact with the amorphous silicon film 52 in the opening portion of the insulating mask film 53, thereby forming a catalytic element-adding region 55. Examples of the usable catalytic element here is a single element or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) (FIG. 10B).

Although the method of adding nickel by a spin coat method is used in Embodiment 4, there may be employed a means of an evaporation method or a sputtering method to form on the amorphous semiconductor film a thin-film including a catalytic element (a nickel film in the case of Embodiment 4).

Figure 10C:
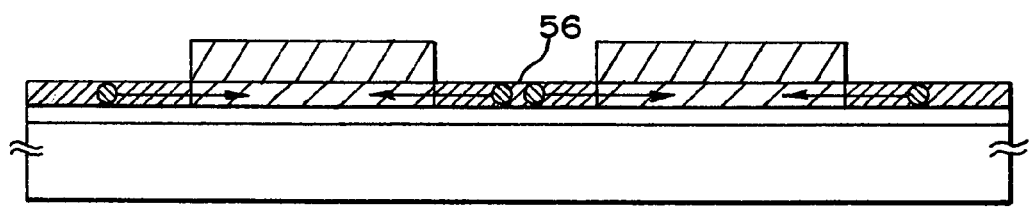

Next, prior to execution of the crystallization process, a thermal treatment is performed at 400 to 500° C. for about 1 hour to desorb hydrogen from within the film, and a thermal treatment at 500 to 650° C. (preferably, 550 to 600° C.) for 6 to 16 hours (preferably, 8 to 14 hours), at 570° C. for 14 hours in Embodiment 4. As a result, an crystal nucleus 56 is generated in the catalytic element-containing region 55, and crystallization progresses in a direction (the direction as indicated by arrow) which is approximately parallel to the substrate with the crystal nucleus 56 as a start point, thereby to form a crystalline semiconductor film (in Embodiment 4, crystalline silicon film) 57 with alignment of macro crystal growth directions (FIGS. 10C and 10D).

Figure 10D:
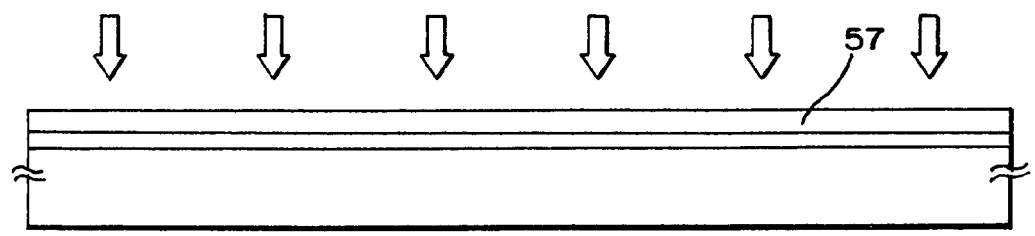

In addition, the crystallinity may be recovered by irradiating a laser light with the crystalline silicon film thus obtained as shown in FIG. 10D.

The crystalline semiconductor film is obtained by adapting the crystallization method described in Embodiment 4 to the crystallization processes in Embodiment Mode and Embodiment 1, and the concentration of the catalytic element of the crystalline semiconductor film is reduced by implementing the present invention, thereby realizing a excellent semiconductor device.

[Embodiment 5]

In this embodiment, an arrangement example of gettering regions in a semiconductor layer, in which an n-type impurity element and a p-type impurity element are contained at a high concentration and to which catalytic elements used for crystallization of a semiconductor film are moved, will be described using FIGS. 15A to 15D and 16.

When this embodiment is applied to the TFT manufacturing process (steps shown in FIG. 4D) of Embodiment 1, variously shaped gettering regions can be formed in the semiconductor layer of an n-channel TFT. Note that, when a mask with a shape as described in a gate electrode etching step in this embodiment is also used for the gettering regions in the semiconductor layer of a p-channel TFT, gettering regions with shapes as described in this embodiment can be realized. In addition, when an area of the gettering regions in the semiconductor layer of the n-channel TFT is made substantially equal to that of the gettering regions in the semiconductor layer of the p-channel TFT, an effect in which gettering efficiencies with respect to catalytic elements are made equal between the n-channel TFT and the p-channel TFT can be further improved. Hereinafter, examples of shapes of the gettering regions formed in the semiconductor layer will be described.

Note that, making the area of the gettering regions in the semiconductor layer of the n-channel TFT substantially equal to that of the gettering regions in the semiconductor layer of the p-channel TFT refers to the following. That is, when a channel forming region width is given as W and a gettering region area is given as S in the respective TFTs, a ratio S/W of the gettering region area S to the channel forming region width W in the n-channel TFT are made substantially equal to that in the p-channel TFT.

Figure 15A:
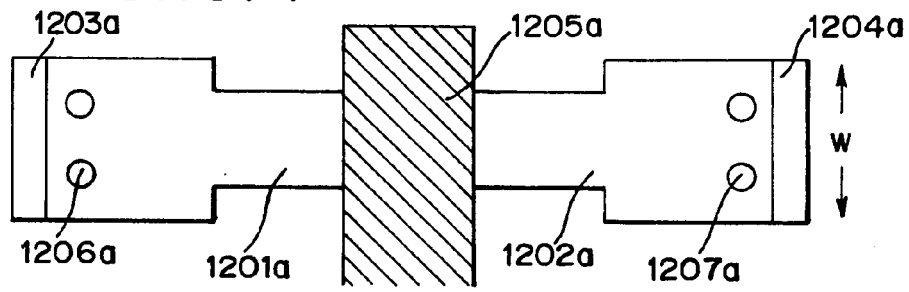
FIGS. 15A to 15D show an embodiment of the present invention.

FIG. 15A shows an example in which gettering regions 1203a and 1204a in which the n-type impurity element and the p-type impurity element are contained at a high concentration are arranged in positions apart from the channel forming region formed in a semiconductor layer region under a gate electrode 1205a (arranged in outer edge portions of the semiconductor layer), each having a rectangular shape with a long side extending in a direction parallel to the gate electrode 1205a, and corner portions of the rectangular shape being overlapped with corner portions of the semiconductor layer. Here, the sum of areas of the gettering regions 1203a and 1204a becomes a total gettering region area S.

Figure 15B:
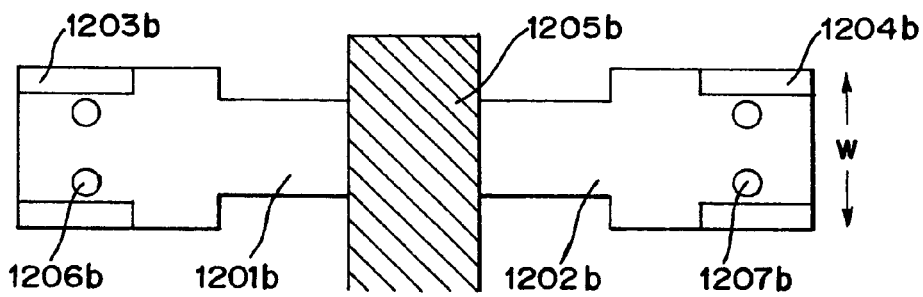

Also, FIG. 15B shows an example in which gettering regions 1203b and 1204b are arranged in positions apart from the channel forming region formed in a semiconductor layer region under a gate electrode 1205b (arranged in outer edge portions of the semiconductor layer), such that each of which has a rectangle shape with a long side extending in a direction perpendicular to the gate electrode 1205b and corner portions of the above rectangle shape are overlapped with corner portions of the semiconductor layer. Here, the sum of areas of the gettering regions 1203b and 1204b becomes a total gettering region area S.

Figure 15C:
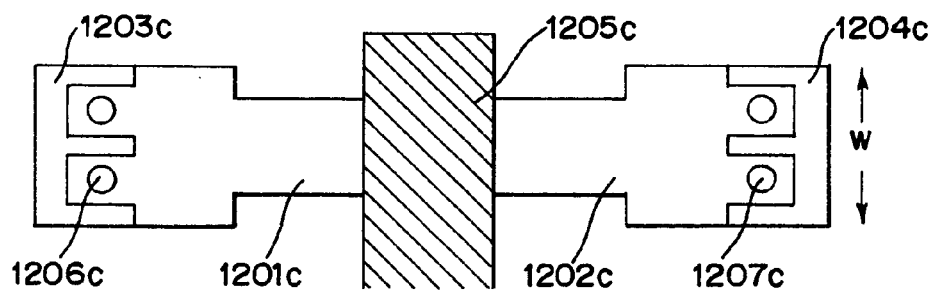

Also, FIG. 15C shows an example in which gettering regions 1203c and 1204c are arranged in positions apart from the channel forming region formed in a semiconductor layer region under a gate electrode 1205c (arranged in outer edge portions of the semiconductor layer), such that each have a complex shape obtained by combining a rectangle with a long side extending in a direction parallel to the gate electrode 1205c and a rectangle with a long side extending in a direction perpendicular thereto, and corner portions of the above shape are overlapped with corner portions of the semiconductor layer. In this case, as compared with FIGS. 15A or 15B as shown above, a gettering region area can be also increased. Here, the sum of areas of the gettering regions 1203c and 1204c becomes a total gettering region area S.

In any of the arrangement examples described above, the gettering regions are arranged in positions where they do not obstruct flow of a current between contact portions formed in the source region or the drain region (portions in which a wiring for electrically connecting the respective TFTs is connected with the semiconductor layer are called the contact portions in this specification). In other words, the gettering regions 1203a and 1204a shown in FIG. 15A are arranged in positions where they do not obstruct flow of a current between contact portions 1206a formed in a source region 1201a and contact portions 1207a formed in a drain region 1202a.

Further, the gettering regions 1203b and 1204b shown in FIG. 15B are located in positions where they do not obstruct flow of a current between contact portions 1206b connected to a source region 1201b and contact portions 1207b formed in a drain region 1202b.

Further, the gettering regions 1203c and 1204c shown in FIG. 15C are located in positions where they do not obstruct flow of between contact portions 1206c formed in a source region 1201c and contact portions 1207c formed in a drain region 1202c.

Figure 15D:
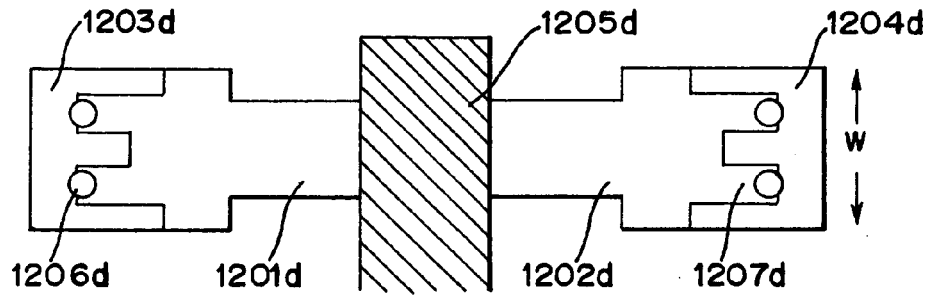

Also, FIG. 15D shows basically the same arrangement example as that shown in FIG. 15C. According to this example, in order to improve gettering efficiency by gettering regions 1203d and 1204d, areas of the gettering regions 1203d and 1204d are further increased so that the gettering region 1203d is overlapped with a portion of contact portions 1206d and the gettering region 1204d is overlapped with a portion of contact portions 1207d. Here, the sum of areas of the gettering regions 1203d and 1204d becomes a total gettering region area S. Basically, there is no problem even if the gettering regions 1203d and 1204d are overlapped with a portion of contact portions 1206d and 1207d. However, attention is required such that an overlapping area becomes a half or less of the areas of the contact portions 1206d and 1207d in maximum. Thus, with respect to a design distance between the contact portions 1206d and 1207d and the gettering regions 1203d and 1204d, it is necessary to determine a suitable design distance in consideration of alignment precision of an exposure apparatus used in a photolithography step for forming the respective region. Note that positions in which high efficiency gettering regions are provided are not limited to those described in this embodiment. The gettering region may be provided in any arbitrary positions where they do not obstruct a current flowing between the source region and the drain region.

Figure 16:
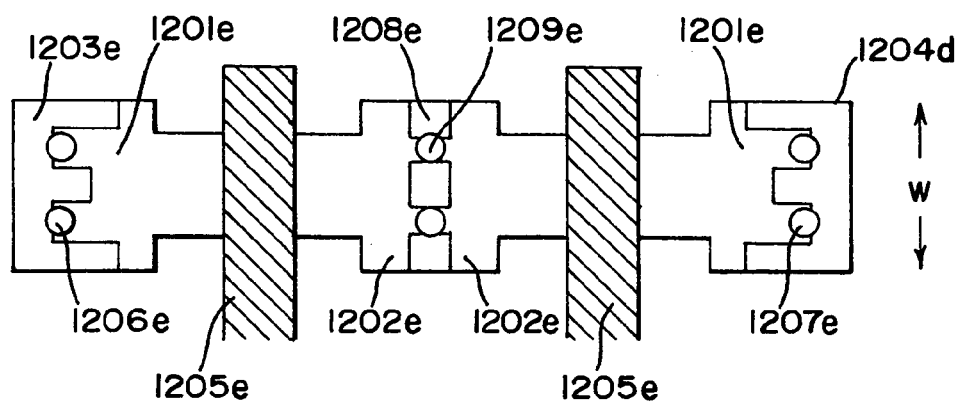
FIG. 16 shows the embodiment of the present invention.

Also, in an example shown in FIG. 16, a plurality of gate electrodes 1205e cross a semiconductor layer and a plurality of channel forming regions are formed thereunder. In addition, source regions 1201e (or drain regions 1202e), gettering regions 1208e, and contact portions 1209e are formed between the plurality of gate electrodes. Note that, as in FIGS. 15A to 15D, gettering regions 1203e and 1204e are formed in outer edge portions of the semiconductor layer, and the source regions 1201e or the drain regions 1202e and contact portions 1206e and 1207e are formed in the inside thereof. Here, the sum of areas of the gettering regions 1203e, 1204e and 1208e becomes a total gettering region area S. Also in the case shown in FIG. 16, the gettering region 1203e may be overlapped with a portion of the contact portions 1206e. However, basically, attention is required such that the overlapping area becomes a half or less of the areas of the contact portions 1206e and 1207e at most. Note that, the present invention can be applied even when the contact portions 1209e are not formed in a region in which TFTs are connected (region sandwiched by 1202e in FIG. 16) as in a clocked inverter, a latch circuit, and the like.

Note that, regardless of the shapes of gettering regions to be applied, since the catalytic elements move to the gettering regions by heat treatment for gettering, a concentration of the catalytic elements becomes $1\times10^{19}/cm^3$ or higher.

Embodiment 5 can be applied in combination with the embodiment mode and Embodiments 1 to 4.

[Embodiment 6]

A CMOS circuit and a pixel portion formed by carrying out the present invention can be used in an active matrix liquid crystal display device. That is, the present invention can be applied to all the electrical devices, each of which incorporates the liquid crystal display device in its display portion.

Examples of such electrical devices may include, a video camera, a digital camera, a projector (rear or front type), a head mounted display (goggle type display), a personal computer, and a portable information terminal (mobile computer, portable phone, electronic book, or the like). Examples of such devices are shown in FIGS. 12A to 12F, 13A to 13D, and 14A to 14C.

Figure 12A:
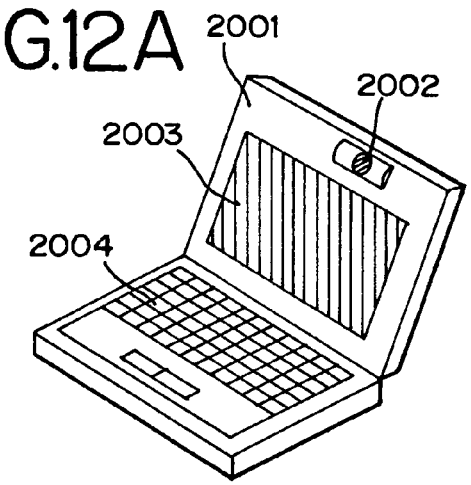
FIGS. 12A to 12F show examples of electrical devices.

FIG. 12A shows a personal computer, which is composed of a main body 2001, an image input portion 2002, a display portion 2003, a keyboard 2004, and the like.

Figure 12B:
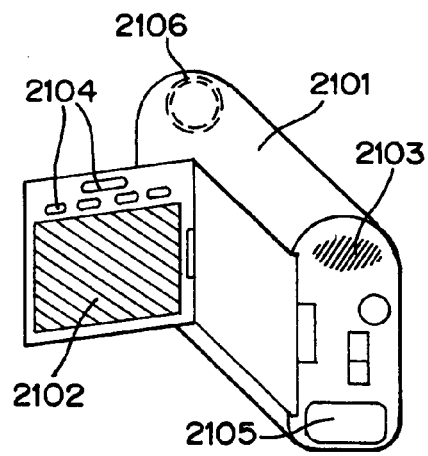

FIG. 12B shows a video camera, which is composed of a main body 2101, a display portion 2102, an audio input portion 2103, operational switches 2104, a battery 2105, an image receiving portion 2106, and the like.

Figure 12C:
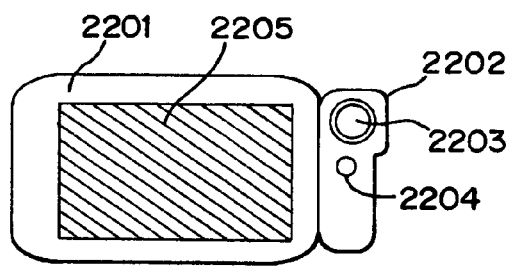

FIG. 12C shows a mobile computer, which is composed of a main body 2201, a camera portion 2202, an image receiving portion 2203, operational switches 2204, a display portion 2205, and the like.

Figure 12D:
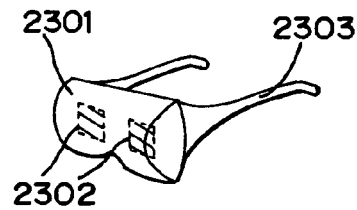

FIG. 12D shows a goggle type display, which is composed of a main body 2301, a display portion 2302, an arm portion 2303, and the like.

Figure 12E:
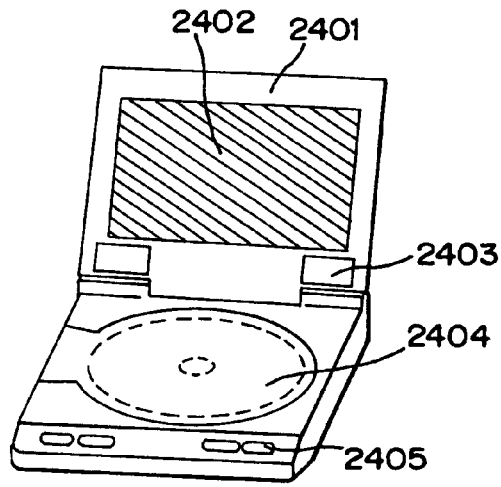

FIG. 12E shows a player using a recording medium having a program recorded thereon (hereinafter referred to as a recording medium), which is composed of a main body 2401, a display portion 2402, a speaker portion 2403, a recording medium 2404, operational switches 2405, and the like. Note that the player uses a medium such as a DVD (digital versatile disc) or a CD as the recording medium, and can be used for music appreciation, film appreciation, games, and accessing the Internet.

Figure 12F:
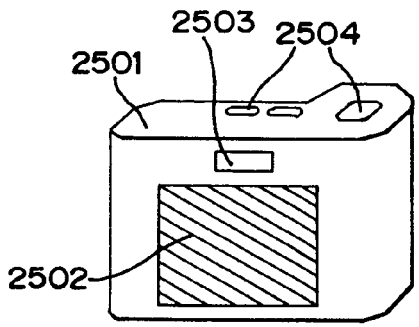

FIG. 12F shows a digital camera, which is composed of a main body 2501, a display portion 2502, an eyepiece portion 2503, operational switches 2504, an image receiving portion (not shown in the figure), and the like.

When the present invention is applied, the semiconductor layer with satisfactory crystallinity using the catalytic element can be formed, and gettering efficiencies of regions that become the n-channel TFT and the p-channel TFT can be made equal. Thus, a characteristic of the n-channel TFT and that of the p-channel TFT are improved so that a satisfactory CMOS driver circuit can be realized. In addition, the catalytic elements can be sufficiently gettered. Thus, in a switching TFT of a pixel, the occurrence of a leak current, which is considered due to the segregation of catalytic elements, can be suppressed. Therefore, there can be realized the electrical devices capable of satisfactory display with no display uniformity (personal computer, video camera, mobile computer, goggle type display, player using a recording medium, and digital camera). (mobile telephone, portable book, and display) can be realized.

Figure 13A:
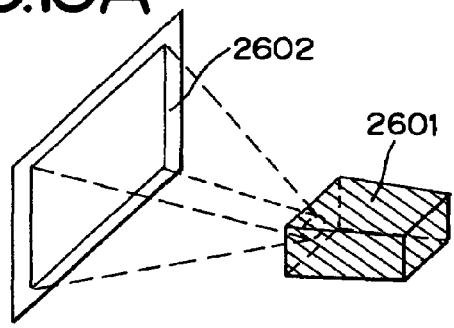
FIGS. 13A to 13D show examples of electrical devices.

FIG. 13A shows a front type projector, which is composed of a projection device 2601, a screen 2602, and the like.

Figure 13B:
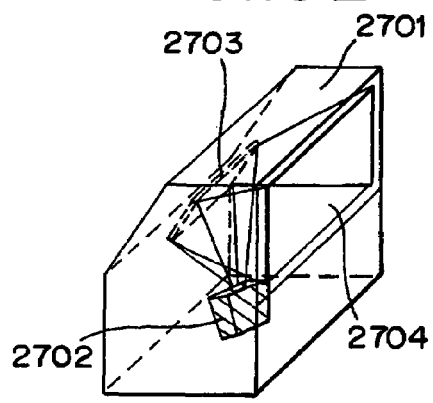

FIG. 13B shows a rear type projector, which is composed of a main body 2701, a projection device 2702, a mirror 2703, a screen 2704, and the like.

Figure 13C:
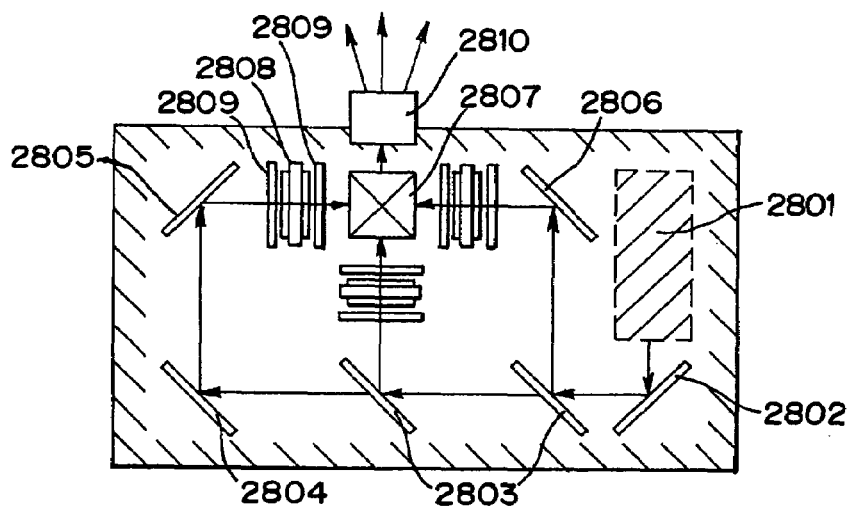

Note that, FIG. 13C is a view of a structural example for the projection devices 2601 and 2702 in FIGS. 13A and 13B. The projection devices 2601 and 2702 are each composed of a light source optical system 2801, mirrors 2802 and 2804 to 2806, dichroic mirrors 2803, a prism 2807, a liquid crystal display device 2808, a phase difference plate 2809, and a projection optical system 2810. The projection optical system 2810 is constituted of an optical system including a projection lens. In this embodiment, a 3-CCD type is shown by way of example, but there is put no particular limitation thereon. For example, a single-CCD type may be employed. Also, the performer may appropriately provide, in some midpoint of an optical path indicated by the arrow of FIG. 17C, an optical system such as an optical lens, a film having a polarization function, a film for adjusting a phase difference, or an IR film.

Figure 13D:
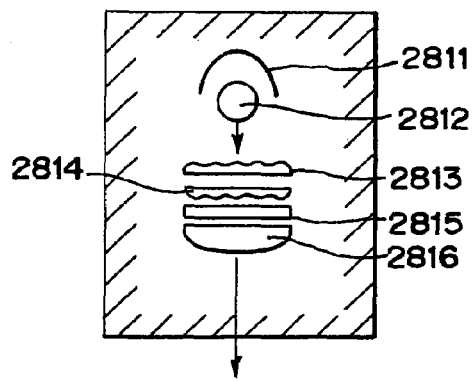

Further, FIG. 13D is a view showing an example of a structure of the light source optical system 2801 shown in FIG. 13C. In this embodiment, the light source optical system 2801 is constituted of a reflector 2811, a light source 2812, lens arrays 2813, 2814, a polarization conversion element 2815, and a condensing lens 2816. Note that, the light source optical system shown in FIG. 13D is only employed as an example, and there is put no particular limitation thereon. For example, the performer may appropriately provide in the light source optical system the optical system such as the optical lens, the film having a polarization function, the film for adjusting a phase difference, or the IR film.

However, in the projector shown in FIGS. 13A to 13D, a transmission type electro-optical device is used, and an example in which a reflection type liquid crystal display device is used is not shown in the figures.

When the present invention is applied, the semiconductor layer with satisfactory crystallinity using the catalytic element can be formed. In addition, the catalytic elements can be sufficiently gettered. Thus, in a switching TFT of a pixel, the occurrence of a leak current that is considered due to the segregation of catalytic elements can be suppressed, so that a projector capable of satisfactory display with no display uniformity can be realized. In addition, since there is no display uniformity, it becomes easier to control a light source, thereby realizing reduction of power consumption.

Figure 14A:
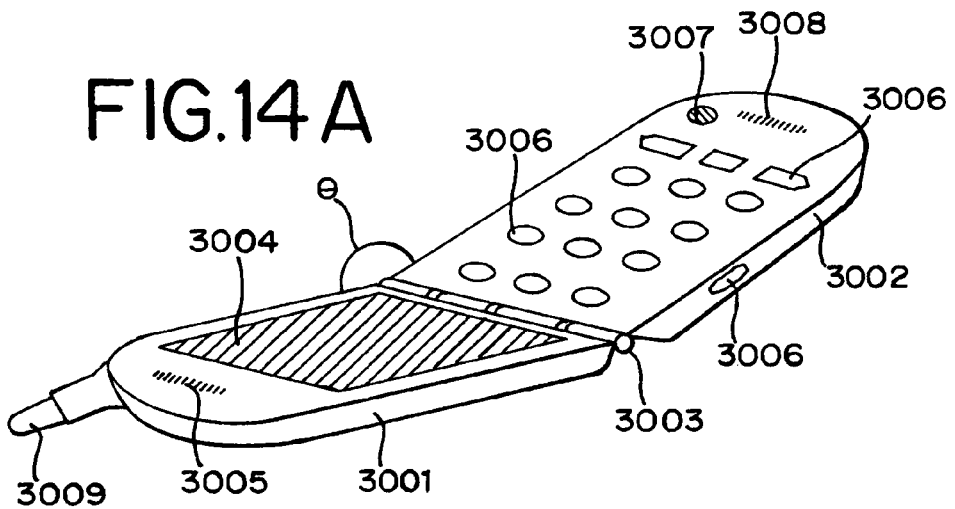
FIGS. 14A to 14C show examples of electrical devices.

FIG. 14A shows a portable phone, which is composed of a display panel 3001 and an operation panel 3002. The display panel 3001 and the operation panel 3002 are connected through a connection portion 3003, in which angle θ between a plane in which a display portion 3004 of the display panel 3001 is formed and a plane in which operational keys 3006 of the operation panel 3002 are formed can be arbitrarily changed.

Further, the portable phone includes an audio output portion 3005, the operational keys 3006, a power supply switch 3007, and an audio input portion 3008.

Figure 14B:
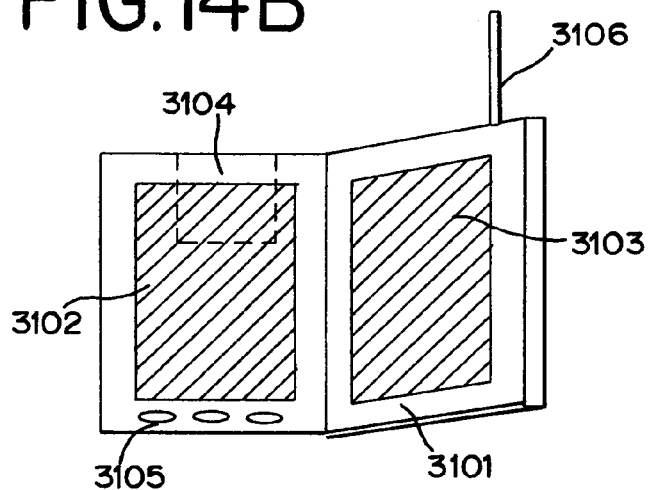

FIG. 14B shows a portable book (electronic book), which is composed of a main body 3101, display portions 3102, 3103, a recording medium 3104, operational switches 3105, an antenna 3106, and the like.

Figure 14C:
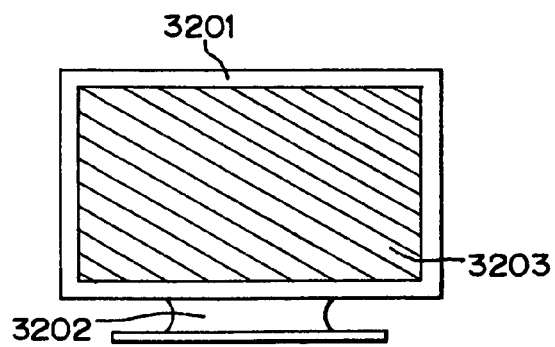

FIG. 14C shows a display (display device), which is composed of a main body 3201, a support stand 3202, a display portion 3203, and the like.

When the present invention is applied, the semiconductor layer with satisfactory crystallinity using the catalytic element can be formed and gettering efficiencies of regions that become the n-channel TFT and the p-channel TFT can be made equal. Thus, characteristics of the n-channel TFT and those of the p-channel TFT are improved so that a satisfactory CMOS driver circuit can be realized. In addition, the catalytic elements can be sufficiently gettered. Thus, in a switching TFT of a pixel, the occurrence of a leak current which is considered due to the segregation of catalytic elements can be suppressed so that satisfactory display with no display uniformity is possible. In addition, because of the satisfactory display with no display uniformity, it is unnecessary to overuse a light source so that wasteful power consumption can be reduced. Therefore, electrical devices (mobile telephone, portable electric book, and display) in which a reduction in power consumption is possible can be realized.

As described above, the application scope of the present invention is extremely wide so that the present invention can be applied to electrical devices in all fields. In addition, the electrical devices of this embodiment can be realized using a display device manufactured by combining the embodiment mode and Embodiments 1 to 5.

When the present invention is used, in a gettering step of reducing a concentration of the catalytic elements left in element regions, in particular, the channel forming region and a junction portion between the channel forming region and the source region or the drain region, of the crystalline semiconductor film having satisfactory crystallinity which is produced using the catalytic elements, efficiencies of gettering can be made equal between the n-channel TFT and the p-channel TFT. Thus, sufficient gettering processing can be conducted for the n-channel TFT and the p-channel TFT so that a satisfactory crystalline semiconductor film can be obtained. In addition, when a TFT using such a semiconductor film is utilized, the occurrence of a leak current can be suppressed so that a satisfactory semiconductor device can be realized.

What is claimed is:

1. A method of manufacturing a semiconductor device comprising:
    forming an amorphous semiconductor film on an insulator;
    adding a catalytic element to the amorphous semiconductor film;
    conducting first heat treatment for the amorphous semiconductor film to form a crystalline semiconductor film;
    etching the crystalline semiconductor film to form at least first and second semiconductor layers;
    forming a gate insulating film on the first and second semiconductor layers;
    forming at least first and second gate electrodes over the first and second semiconductor layers, respectively, with the gate insulating film interposed therebetween;
    adding an n-type impurity element to a source region, a drain region, and a gettering region in the first semiconductor layer and a gettering region in the second semiconductor layer;
    adding a p-type impurity element to the gettering region in the first semiconductor layer and a source region, a drain region, and the gettering region in the second semiconductor layer; and conducting second heat treatment to move the catalytic element in the first and second semiconductor layers to the gettering regions to which the n-type impurity element and the p-type impurity element are added,
    wherein the source region and the drain region of the second semiconductor layer include only the p-type impurity element.

2. A method according to claim 1,
    wherein each of the gettering regions in the first and second semiconductor layers is formed outside a region in which either of electrons and holes move in the source region and the drain region.

3. A method according to claim 1,
    wherein each of the gettering regions in the first and second semiconductor layers is formed so as to be adjacent to one of the source region and the drain region and so as not to be adjacent to at least a channel forming region formed under each the first and second gate electrodes.

4. A method according to claim 1, further comprising a step of forming wirings so as to connect with at least the source and drain regions in each of the first and second semiconductor layers,
    wherein the gettering regions in the first and second semiconductor layers are formed adjacent to portions to which the wirings are connected.

5. A method according to claim 1, further comprising a step of connecting the semiconductor layer of the n-channel TFT and the semiconductor layer of the p-channel TFT with a wiring for electrically connecting between the n-channel TFT and the p-channel TFT,
    wherein connection with the wiring is made through a region including a portion of the gettering region and a region except the gettering region in the semiconductor layer of the n-channel TFT and the semiconductor layer of the p-channel TFT.

6. A method according to claim 1, further comprising a step of forming wirings so as to connect with at least the source and drain regions in each of the first and second semiconductor layers,
    wherein the wiring is connected with regions except the gettering regions in the first and second semiconductor layers.

7. A method according to claim 1, further comprising a step of connecting the semiconductor layer of the n-channel TFT and the semiconductor layer of the p-channel TFT with a wiring for electrically connecting between the n-channel TFT and the p-channel TFT, wherein the gettering region in the semiconductor layer of the n-channel TFT and the semiconductor layer of the p-channel TFT is formed such that a ratio (S/W) of an area of the gettering region (S) to a width of the channel forming region (W) in the n-channel TFT is substantially equal to that in the p-channel TFT.

8. A method according to claim 1,
wherein a distance from an end portion of the first gate electrode to the gettering region in the first semiconductor layer is substantially equal to that in the second semiconductor layer.

9. A method according to claim 1, wherein the n-type impurity element is added to the first and second semiconductor layers at a concentration of $1\times10^{19}/cm^3$ to $1\times10^{21}/cm^3$, and
wherein the p-type impurity element is added to the first and second semiconductor layers at a concentration of $1.5\times10^{19}/cm^3$ to $3\times10^{21}/cm^3$.

10. A method according to claim 1, after the first heat treatment, further comprising a step of irradiating laser light to the crystalline semiconductor film.

11. A method according to claim 1, wherein the second heat treatment further activates the n-type impurity element and the p-type impurity element which are added to the first and second semiconductor layers.

12. A method according to claim 1, wherein the catalytic element uses at least one element selected from the group consisting of Ni, Co, Sn, Pb, Pd, Fe, and Cu.

13. A method of manufacturing a semiconductor device comprising:
forming an amorphous semiconductor film on an insulator;
adding a catalytic element to the amorphous semiconductor film;
conducting first heat treatment for the amorphous semiconductor film to form a crystalline semiconductor film;
etching the crystalline semiconductor film to form at least first and second semiconductor layers;
forming a gate insulating film on the first and second semiconductor layers;
forming at least first and second gate electrodes over the first and second semiconductor layers, respectively, with the gate insulating film interposed therebetween;
adding an n-type impurity element to the first and second semiconductor layers using the first and second gate electrodes as masks to form a source region, a drain region, and a gettering region in the first semiconductor layer and a gettering region in the second semiconductor layer;
forming a first mask over the first semiconductor layer and a second mask on the second gate electrode and then etching the second gate electrode to form a third gate electrode;
adding a p-type impurity element to the first and second semiconductor layers using the first and second masks and the third gate electrode as masks to form the gettering region in the first semiconductor layer and a source region, a drain region, and the gettering region in the second semiconductor layer; and
conducting second heat treatment to move the catalytic element in the first and second semiconductor layers to the gettering regions to which the n-type impurity element and the p-type impurity element are added.

14. A method according to claim 13,
wherein each of the gettering regions in the first and second semiconductor layers is formed outside a region in which either of electrons and holes move in the source region and the drain region.

15. A method according to claim 13,
wherein each of the gettering regions in the first and second semiconductor layers is formed so as to be adjacent to one of the source region and the drain region and so as not to be adjacent to at least a channel forming region formed under each the first and second gate electrodes.

16. A method according to claim 13, further comprising a step of forming wirings so as to connect With at least the source and drain regions in each of the first and second semiconductor layers,
wherein the gettering regions in the first and second semiconductor layers are formed adjacent to portions to which the wirings are connected.

17. A method according to claim 13, further comprising a step of connecting the semiconductor layer of the n-channel TFT and the semiconductor layer of the p-channel TFT with a wiring for electrically connecting between the n-channel TFT and the p-channel TFT,
wherein connection with the wiring is made through a region including a portion of the gettering region and a region except the gettering region in the semiconductor layer of the n-channel TFT and the semiconductor layer of the p-channel TFT.

18. A method according to claim 13, further comprising a step of forming wirings so as to connect with at least the source and drain regions in each of the first and second semiconductor layers,
wherein the wiring is connected with regions except the gettering regions in the first and second semiconductor layers.

19. A method according to claim 13, further comprising a step of connecting the semiconductor layer of the n-channel TFT and the semiconductor layer of the p-channel TFT with a wiring for electrically connecting between the n-channel TFT and the p-channel TFT,
wherein the gettering region in the semiconductor layer of the n-channel TFT and the semiconductor layer of the p-channel TFT is formed such that a ratio (S/W) of an area of the gettering region (S) to a width of the channel forming region (W) in the n-channel TFT is substantially equal to that in the p-channel TFT.

20. A method according to claim 13,
wherein a distance from an end portion of the first gate electrode to the gettering region in the first semiconductor layer is substantially equal to that in the second semiconductor layer.

21. A method according to claim 13, wherein the n-type impurity element is added to the first and second semiconductor layers at a concentration of $1\times10^{19}/cm^3$ to $1\times10^{21}/cm^3$, and
wherein the p-type impurity element is added to the first and second semiconductor layers at a concentration of $1.5\times10^{19}/cm^3$ to $3\times10^{21}/cm^3$.

22. A method according to claim 13, after the first heat treatment, further comprising a step of irradiating laser light to the crystalline semiconductor film.

23. A method according to claim 13, wherein the second gate electrode is formed to have a larger width than that of the third gate electrode.

24. A method according to claim 13, wherein the second heat treatment further activates the n-type impurity element and the p-type impurity element which are added to the first and second semiconductor layers.

25. A method according to claim 13, wherein the catalytic element uses at least one element selected from the group consisting of Ni, Co, Sn, Pb, Pd, Fe, and Cu.

26. A method according to claim 13, wherein the first mask is not overlapped with the gettering region in the first semiconductor layer.

27. A method of manufacturing a semiconductor device comprising:
   forming a crystalline semiconductor film over a substrate, the crystalline semiconductor film including at least a catalytic element;
   forming at least first and second semiconductor layers over the substrate by etching the crystalline semiconductor film;
   forming at least first and second gate electrode over the first and second semiconductor layers, respectively, with a gate insulating film interposed therebetween;
   adding an n-type impurity element to a source region, a drain region, and a gettering region in the first semiconductor layer and a gettering region in the second semiconductor layer;
   adding a p-type impurity element to the gettering region in the first semiconductor layer and a source region, a drain region, and the gettering region in the second semiconductor layer; and
   conducting a heat treatment to move the catalytic element to the gettering regions in the first and second semiconductor layers,
   wherein the source region and the drain region of the second semiconductor layer include only the p-type impurity element.

28. A method according to claim 27, wherein each of the gettering regions in the first and second semiconductor layers is formed outside a region in which either of electrons and holes move in the source region and the drain region.

29. A method according to claim 27, wherein each of the gettering regions in the first and second semiconductor layers is formed so as to be adjacent to one of the source region and the drain region and so as not to be adjacent to at least a channel forming region formed under each the first and second gate electrodes.

30. A method according to claim 27, further comprising a step of forming wirings so as to connect with at least the source and drain regions in each of the first and second semiconductor layers.

31. A method according to claim 27, wherein the gettering regions in the first and second semiconductor layers are formed adjacent to portions to which the wirings are connected.

32. A method according to claim 27, wherein the wiring is connected with regions except the gettering regions in the first and second semiconductor layers.

33. A method according to claim 27, wherein a distance from an end portion of the first gate electrode to the gettering region in the first semiconductor layer is substantially equal to that in the second semiconductor layer.

34. A method according to claim 27, wherein the n-type impurity element is added to the first and second semiconductor layers at a concentration of $1 \times 10^{19}/cm^3$ to $1 \times 10^{21}/cm^3$, and
   wherein the p-type impurity element is added to the first and second semiconductor layers at a concentration of $1.5 \times 10^{19}/cm^3$ to $3 \times 10^{21}/cm^3$.

35. A method according to claim 27, further comprising a step of irradiating laser light to the crystalline semiconductor film.

36. A method according to claim 27, wherein the heat treatment further activates the n-type impurity element and the p-type impurity element which are added to the first and second semiconductor layers.

37. A method according to claim 27, wherein the catalytic element is at least one element selected from the group consisting of Ni, Co, Sn, Pb, Pd, Fe, and Cu.

38. A method of manufacturing a semiconductor device comprising:
   forming a crystalline semiconductor film over a substrate, the crystalline semiconductor film including at least a catalytic element;
   forming at least first and second semiconductor layers over the substrate by etching the crystalline semiconductor film;
   forming at least first and second gate electrode over the first and second semiconductor layers, respectively, with a gate insulating film interposed therebetween;
   adding an n-type impurity element to the first and second semiconductor layers using the first and second gate electrodes as masks to form a source region, a drain region, and a gettering region in the first semiconductor and a gettering region in the second semiconductor layer;
   forming a first mask over the first electrode and a portion of the first semiconductor layer and a second mask over the second gate electrode;
   etching the second gate electrode to form a third gate electrode over the second semiconductor layer;
   adding a p-type impurity element to the first and second semiconductor layers using the first mask and the third gate electrode as masks to form the gettering region in the first semiconductor layer and a source region, a drain region, and the gettering region in the second semiconductor layer; and
   conducting a heat treatment to move the catalytic element to the gettering regions in the first and second semiconductor layers.

39. A method according to claim 38, wherein each of the gettering regions in the first and second semiconductor layers is formed outside a region in which either of electrons and holes move in the source region and the drain region.

40. A method according to claim 38, wherein each of the gettering regions in the first and second semiconductor layers is formed so as to be adjacent to one of the source region and the drain region and so as not to be adjacent to at least a channel forming region formed under each the first and second gate electrodes.

41. A method according to claim 38, further comprising a step of forming wirings so as to connect with at least the source and drain regions in each of the first and second semiconductor layers,
   wherein the gettering regions in the first and second semiconductor layers are formed adjacent to portions to which the wirings are connected.

42. A method according to claim 38, further comprising a step of forming wirings so as to connect with at least the source and drain regions in each of the first and second semiconductor layers,
   wherein connected with regions except the gettering regions in the first and second semiconductor layers.

43. A method according to claim 38, wherein a distance from an end portion of the first gate electrode to the gettering region in the first semiconductor layer is substantially equal to that in the second semiconductor layer.

44. A method according to claim 38, wherein the n-type impurity element is added to the first and second semiconductor layers at a concentration of $1\times10^{19}/cm^3$ to $1\times10^{21}/cm^3$, and wherein the p-type impurity element is added to the first and second semiconductor layers at a concentration of $1.5\times10^{19}/cm^3$ to $3\times10^{21}/cm^3$.

45. A method according to claim 38, further comprising a step of irradiating laser light to the crystalline semiconductor film.

46. A method according to claim 38, wherein the second gate electrode is formed to have a larger width than that of the third gate electrode.

47. A method according to claim 38, wherein the heat treatment further activates the n-type impurity element and the p-type impurity element which are added to the first and second semiconductor layers.

48. A method according to claim 38, wherein the catalytic element is at least one element selected from the group consisting of Ni, Co, Sn, Pb, Pd, Fe, and Cu.

49. A method according to claim 38, wherein the first mask is not overlapped with the gettering region in the first semiconductor layer.

* * * * *